(12) United States Patent
Hermanowski

(10) Patent No.: US 8,343,300 B2
(45) Date of Patent: Jan. 1, 2013

(54) AUTOMATED THERMAL SLIDE DEBONDER

(75) Inventor: James Hermanowski, Waterbury, VT (US)

(73) Assignee: Suss Microtec Lithography, GmbH, Garching (DE)

( * ) Notice: Subject to any disclaimer, the term of this patent is extended or adjusted under 35 U.S.C. 154(b) by 131 days.

(21) Appl. No.: 12/975,521

(22) Filed: Dec. 22, 2010

(65) Prior Publication Data

US 2011/0146901 A1 Jun. 23, 2011
US 2012/0037307 A9 Feb. 16, 2012

Related U.S. Application Data

(60) Provisional application No. 61/289,634, filed on Dec. 23, 2009.

(51) Int. Cl.

| | |
|---|---|
| B29C 65/00 | (2006.01) |
| B29C 63/00 | (2006.01) |
| B32B 37/00 | (2006.01) |
| B32B 38/00 | (2006.01) |
| B65H 1/00 | (2006.01) |
| B65G 25/00 | (2006.01) |
| B66C 17/08 | (2006.01) |
| H01L 21/677 | (2006.01) |
| B24B 49/00 | (2012.01) |
| B24B 51/00 | (2006.01) |
| B24B 1/00 | (2006.01) |
| B24B 7/19 | (2006.01) |
| B24B 7/30 | (2006.01) |
| B24B 3/00 | (2006.01) |
| B24B 5/18 | (2006.01) |
| B24B 5/00 | (2006.01) |
| B24B 29/00 | (2006.01) |

(52) U.S. Cl. ........ 156/281; 156/285; 156/286; 156/707; 156/382; 156/758; 414/225.01; 414/200; 414/217; 414/201; 451/43; 451/141; 451/5; 451/285

(58) Field of Classification Search ........... 156/281, 156/285, 286, 707, 382, 758; 414/225.01, 414/200, 217, 201; 451/43, 141, 5, 285
See application file for complete search history.

(56) References Cited

U.S. PATENT DOCUMENTS

| | | | | |
|---|---|---|---|---|
| 5,273,615 A | * | 12/1993 | Asetta et al. | 156/750 |
| 5,679,060 A | * | 10/1997 | Leonard et al. | 451/43 |
| 5,950,643 A | | 9/1999 | Miyazaki et al. | |
| 2003/0057130 A1 | * | 3/2003 | Fix et al. | 206/710 |

(Continued)

FOREIGN PATENT DOCUMENTS

WO WO2008146994 A1 12/2008

*Primary Examiner* — Christopher Schatz
*Assistant Examiner* — Matthew Hoover
(74) *Attorney, Agent, or Firm* — AKC Patents LLC; Aliki K. Collins

(57) ABSTRACT

An improved apparatus for debonding temporary bonded wafers includes a debonder, a cleaning module and a taping module. A vacuum chuck is used in the debonder for holding the debonded thinned wafer and remains with the thinned debonded wafer during the follow up processes steps of cleaning and mounting onto a dicing tape. In one embodiment the debonded thinned wafer remains onto the vacuum chuck and is moved with the vacuum chuck into the cleaning module and then the taping module. In another embodiment the debonded thinned wafer remains onto the vacuum chuck and first the cleaning module moves over the thinned wafer to clean the wafer and then the taping module moves over the thinned wafer to mount a dicing tape onto the wafer.

24 Claims, 22 Drawing Sheets

U.S. PATENT DOCUMENTS

| | | |
|---|---|---|
| 2003/0077854 A1 | 4/2003 | Teshirogi et al. |
| 2005/0034821 A1 | 2/2005 | Yanagita et al. |
| 2005/0266658 A1 | 12/2005 | Couillard et al. |
| 2010/0266373 A1* | 10/2010 | George et al. ............ 414/225.01 |

* cited by examiner

- Process Basics
  - Place bottom wafer on fixture chuck
  - Place top adhesive carrier direct
  - Manual Align
  - Load into chamber
  - Top chuck down, force
  - Vacuum pump down
  - Heat to ~200C
  - Cool to unload temp
  - Unload fixture

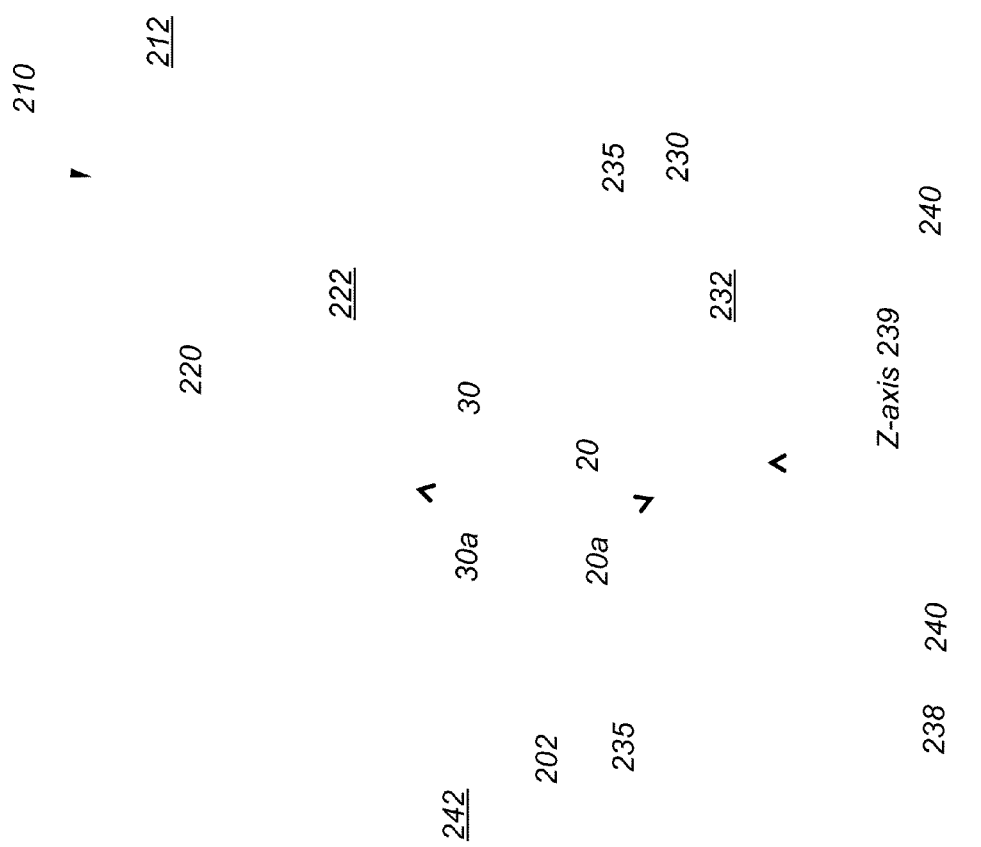

AUTOMATED THERMAL SLIDE DEBONDER

CROSS REFERENCE TO RELATED CO-PENDING APPLICATIONS

This application claims the benefit of U.S. provisional application Ser. No. 61/289,634 filed Dec. 23, 2009 and entitled "AUTOMATED THERMAL SLIDE DEBONDER", the contents of which are expressly incorporated herein by reference.

FIELD OF THE INVENTION

The present invention relates to an apparatus for temporary semiconductor wafer bonding and debonding, and more particularly to an industrial-scale apparatus for temporary wafer bonding and debonding that comprises an automated thermal slide debonder.

BACKGROUND OF THE INVENTION

Several semiconductor wafer processes include wafer thinning steps. In some applications the wafers are thinned down to a thickness of less than 100 micrometers for the fabrication of integrated circuit (IC) devices. Thin wafers have the advantages of improved heat removal and better electrical operation of the fabricated IC devices. In one example, GaAs wafers are thinned down to 25 micrometers to fabricate power CMOS devices with improved heat removal. Wafer thinning also contributes to a reduction of the device capacitance and to an increase of its impedance, both of which result in an overall size reduction of the fabricated device. In other applications, wafer thinning is used for 3D-Integration bonding and for fabricating through wafer vias.

Wafer thinning is usually performed via back-grinding and/or chemical mechanical polishing (CMP). CMP involves bringing the wafer surface into contact with a hard and flat rotating horizontal platter in the presence of a liquid slurry. The slurry usually contains abrasive powders, such as diamond or silicon carbide, along with chemical etchants such as ammonia, fluoride, or combinations thereof. The abrasives cause substrate thinning, while the etchants polish the substrate surface at the submicron level. The wafer is maintained in contact with the abrasives until a certain amount of substrate has been removed in order to achieve a targeted thickness.

For wafer thicknesses of over 200 micrometers, the wafer is usually held in place with a fixture that utilizes a vacuum chuck or some other means of mechanical attachment. However, for wafer thicknesses of less than 200 micrometer and especially for wafers of less than 100 micrometers, it becomes increasingly difficult to mechanically hold the wafers and to maintain control of the planarity and integrity of the wafers during thinning. In these cases, it is actually common for wafers to develop microfractures and to break during CMP.

An alternative to mechanical holding of the wafers during thinning involves attaching a first surface of the device wafer (i.e., wafer processed into a device) onto a carrier wafer and thinning down the exposed opposite device wafer surface. The bond between the carrier wafer and the device wafer is temporary and is removed (i.e., debonded) upon completion of the thinning processing steps.

Several temporary bonding techniques have been suggested including using of adhesive compounds that are chemically dissolved after processing or using of adhesive tapes or layers that are thermally or via radiation decomposed after processing. Most of these adhesive-based temporary bonding techniques are followed by a thermal slide debonding process where the device wafer and the carrier wafer are held by vacuum chucks while heat is applied to the bonded wafer pair and the wafers slide apart from each other. In the current thermal slide debonding process the separated thinned device wafer is held via a secondary support mechanism for further processing. This secondary support mechanism usually adds cost and complications to the processing equipment. It is desirable to reduce the added cost and complications.

SUMMARY OF THE INVENTION

An improved apparatus for temporary wafer bonding and debonding 100 includes a temporary bonder 110, a wafer thinning station 120, a debonder 150, a cleaning module 170 and a taping module 180, as shown in FIG. 2 and FIG. 3. Usually a secondary carrier is used for moving the thinned wafer from the debonder 120 to the cleaning 170 and taping 180 modules. The present invention eliminates the need for a secondary carrier by allowing a vacuum chuck 152 used in the thermal slide debonder 150 to remain with the thinned wafer 20 during the follow up processes steps of cleaning (52) and mounting onto a dicing tape (53). In one embodiment the thinned wafer 20 remains onto the vacuum chuck 152 and is moved with the vacuum chuck 152 into the various process stations, shown in FIG. 2. In another embodiment the thinned wafer 20 remains onto the vacuum chuck 152 and the various process stations 170, 180 move over the thinned wafer 20 to perform the various process steps, shown in FIG. 3.

In general, in one aspect, the invention features an apparatus for processing a temporary bonded wafer pair comprising a device wafer and a carrier wafer. The apparatus includes a debonder for debonding the device wafer from the carrier wafer after it has been thinned, a cleaning module for cleaning the debonded thinned device wafer, a taping module for applying a tape onto the debonded thinned device wafer and a vacuum chuck. The vacuum chuck is used in the debonder and includes means for holding the debonded thinned device wafer. The apparatus also includes means for moving the vacuum chuck with the debonded thinned device wafer into and out of the cleaning module and into and out of the taping module.

In general, in another aspect, the invention features an apparatus for processing a temporary bonded wafer pair comprising a device wafer and a carrier wafer. The apparatus includes a debonder for debonding the device wafer from the carrier wafer after it has been thinned, a cleaning module for cleaning the debonded thinned device wafer, a taping module, and a vacuum chuck used in the debonder and including means for holding the debonded thinned device wafer during debonding, cleaning and taping. The cleaning module includes means for moving over the debonded thinned wafer in the debonder for cleaning the debonded thinned wafer. The taping module includes means for moving over the debonded thinned wafer in the debonder for applying the tape onto the debonded thinned wafer.

Implementations of these aspects of the invention may include one or more of the following features. The debonder includes a top chuck assembly, a bottom chuck assembly, a static gantry supporting the top chuck assembly, an X-axis carriage drive supporting the bottom chuck assembly and an X-axis drive control configured to drive horizontally the X-axis carriage drive and the bottom chuck assembly from a loading zone to a process zone under the top chuck assembly and from the process zone back to the loading zone, and the bottom chuck assembly includes the vacuum chuck. The top chuck assembly includes a top support chuck bolted to the static gantry, a heater support plate in contact with the bottom surface of the top support chuck, a heater being in contact with the bottom surface of the heater support plate, a top wafer plate in contact with the heater, a Z-axis drive for moving the top wafer plate in the Z-direction and placing the top wafer plate in contact with the unbonded surface of the carrier wafer and a plate leveling system for leveling the top wafer plate and for providing wedge error compensation of the top wafer plate. The apparatus further includes a lift pin assembly for raising and lowering the wafer pair onto the bottom chuck assembly. The bonder further includes a base plate supporting the X-axis carriage drive and the static gantry and the base plate includes one of a honeycomb structure with vibration isolation supports or a granite plate. The apparatus further includes means for twisting the device wafer at the same time the horizontal motion is initiated. The X-axis carriage drive includes an air bearing carriage drive. The debonder further includes two parallel lateral carriage guidance tracks guiding the X-axis carriage drive in its horizontal motion along the X-axis. The carrier wafer is held by the top chuck assembly via vacuum pulling. The plate leveling system includes three guide shafts connecting the heater to the top support chuck and three pneumatically actuated split clamps. The heater includes two independently controlled concentric heating zones configured to heat wafers having a diameter of 200 or 300 millimeters, respectively. The apparatus further includes a bonder for temporary bonding the wafer pair and a wafer thinning module for thinning the device wafer of the temporarily bonded wafer pair.

In general, in another aspect, the invention features a method for debonding and processing two via an adhesive layer temporary bonded wafers. The method includes the following steps. First, providing a bonder comprising a top chuck assembly, a bottom chuck assembly, a static gantry supporting the top chuck assembly, an X-axis carriage drive supporting the bottom chuck assembly and an X-axis drive control configured to drive horizontally the X-axis carriage drive and the bottom chuck assembly from a loading zone to a process zone under the top chuck assembly and from the process zone back to the loading zone. The bottom chuck assembly comprises a vacuum chuck. Next, loading a wafer pair comprising a carrier wafer bonded to a device wafer via an adhesive layer upon the bottom chuck assembly at the loading zone oriented so that the unbonded surface of the device wafer is in contact with the bottom chuck assembly. Next, driving the X-axis carriage drive and the bottom chuck assembly to the process zone under the top chuck assembly. Next, placing the unbonded surface of the carrier wafer in contact with the top chuck assembly and holding the carrier wafer by the top chuck assembly. Next, heating the carrier wafer with a heater comprised in the top chuck assembly to a temperature around or above the adhesive layer's melting point. Next, initiating horizontal motion of the X-axis carriage drive along the X-axis by the X-axis drive control while heat is applied to the carrier wafer and while the carrier wafer is held by the top chuck assembly and the device wafer is held by the bottom chuck assembly and thereby causing the device wafer to separate and slide away from the carrier wafer. Next, moving the vacuum chuck with the debonded thinned device wafer into a cleaning station and removing any residual adhesive off the device wafer and then moving the vacuum chuck with the cleaned debonded thinned device wafer into a taping module and applying a tape to a surface of the debonded thinned device wafer. Finally, removing the taped debonded device wafer from the vacuum chuck and placing it into a device wafer cassette. The residual adhesive is removed by using a solvent and applying spin cleaning techniques. The top chuck assembly further includes a top support chuck bolted to the static gantry, a heater support plate in contact with the bottom surface of the top support chuck, a heater being in contact with the bottom surface of the heater support plate, a top wafer plate in contact with the heater, a Z-axis drive for moving the top wafer plate in the Z-direction and placing the top wafer plate in contact with the unbonded surface of the carrier wafer and a plate leveling system for leveling the top wafer plate and for providing wedge error compensation of the top wafer plate.

In general, in another aspect, the invention features a method for debonding and processing two via an adhesive layer temporary bonded wafers. The method includes the following steps. First, providing a chamber comprising a top chuck assembly, a bottom chuck assembly, an X-axis carriage drive supporting the bottom chuck assembly and an X-axis drive control configured to drive horizontally the X-axis carriage drive and the bottom chuck assembly from a loading zone to a process zone and from the process zone back to the loading zone. Next, loading a wafer pair comprising a carrier wafer bonded to a device wafer via an adhesive layer upon the bottom chuck assembly at the loading zone oriented so that the unbonded surface of the device wafer is in contact with the bottom chuck assembly. Next, driving the X-axis carriage drive and the bottom chuck assembly to the process zone and placing the top chuck assembly on top of the bottom chuck assembly. Next, placing the unbonded surface of the carrier wafer in contact with the top chuck assembly and holding the carrier wafer by the top chuck assembly. Next, heating the carrier wafer with a heater comprised in the top chuck assembly to a temperature around or above the adhesive layer's melting point. Next, initiating horizontal motion of the X-axis carriage drive along the X-axis by the X-axis drive control while heat is applied to the carrier wafer and while the carrier wafer is held by the top chuck assembly and the device wafer is held by the bottom chuck assembly and thereby causing the device wafer to debond and slide away from the carrier wafer. Next, moving the top chuck assembly with the debonded carrier wafer away from the process zone. Next, moving a cleaning station module into the chamber over the debonded device wafer and removing any residual adhesive off the device wafer. Next, moving the cleaning station module out of the chamber after any residual adhesive is removed off the device wafer. Next, moving a taping module into the chamber over the debonded and cleaned device wafer and applying a tape to a surface of the debonded device wafer and then removing the taped debonded device wafer from the bottom chuck assembly and placing it into a device wafer cassette. The residual adhesive is removed by using a solvent and applying spin cleaning techniques. The top chuck assembly further includes a top support chuck bolted to the static gantry, a heater support plate in contact with the bottom surface of the top support chuck, a heater being in contact with the bottom surface of the heater support plate, a top wafer plate in contact with the heater, a Z-axis drive for moving the top wafer plate in the Z-direction and placing the top wafer plate in contact with the unbonded surface of the carrier wafer and a plate leveling system for leveling the top wafer plate and for providing wedge error compensation of the top wafer plate.

BRIEF DESCRIPTION OF THE DRAWINGS

Referring to the figures, wherein like numerals represent like parts throughout the several views.

DETAILED DESCRIPTION OF THE INVENTION

Figure 1:
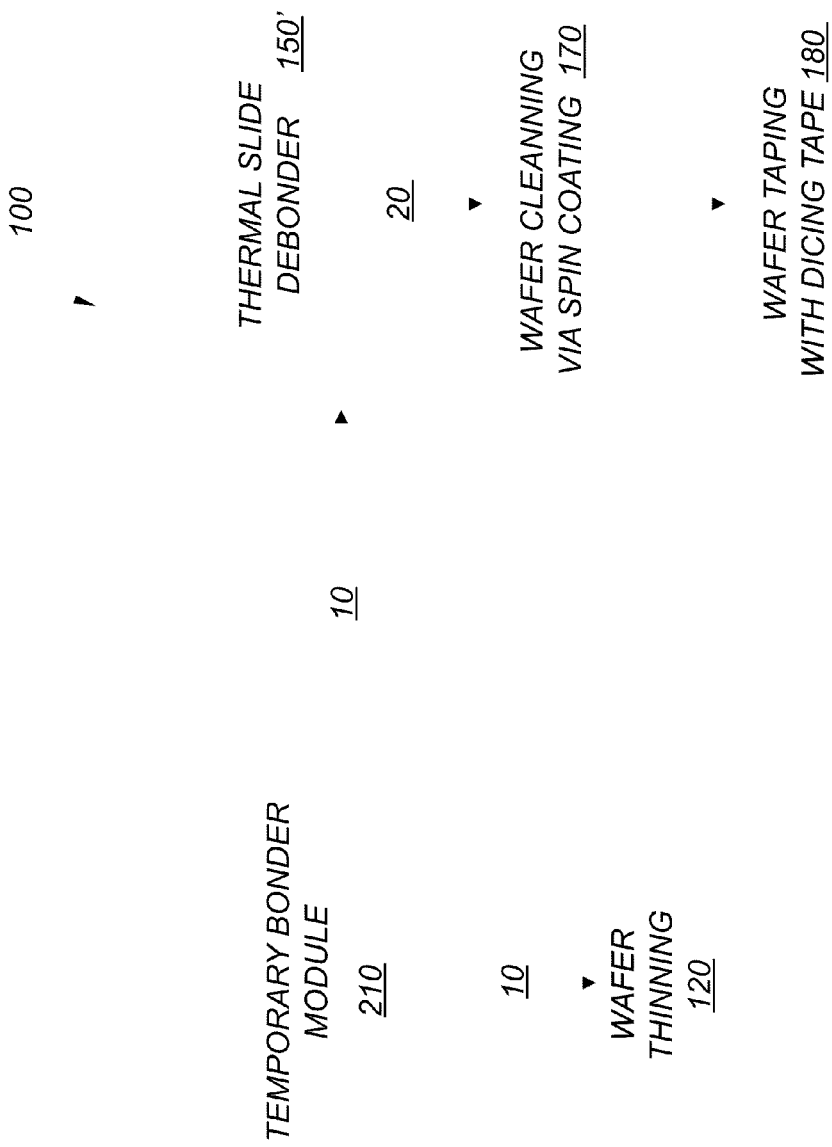
FIG. 1 is an overview schematic diagram of a prior art temporary wafer bonder and debonder system.

Referring to FIG. 1, an apparatus for temporary wafer bonding 100 includes a temporary bonder 210, a wafer thinning module 120, a thermal slide debonder 150', a wafer cleaning station 170 and a wafer taping station 180. Bonder 210 facilitates the temporary bonding processes 60a, shown in FIG. 1A and debonder 150' facilitates the thermal slide debonding processes 60b, shown in FIG. 1A.

Figure 1A:
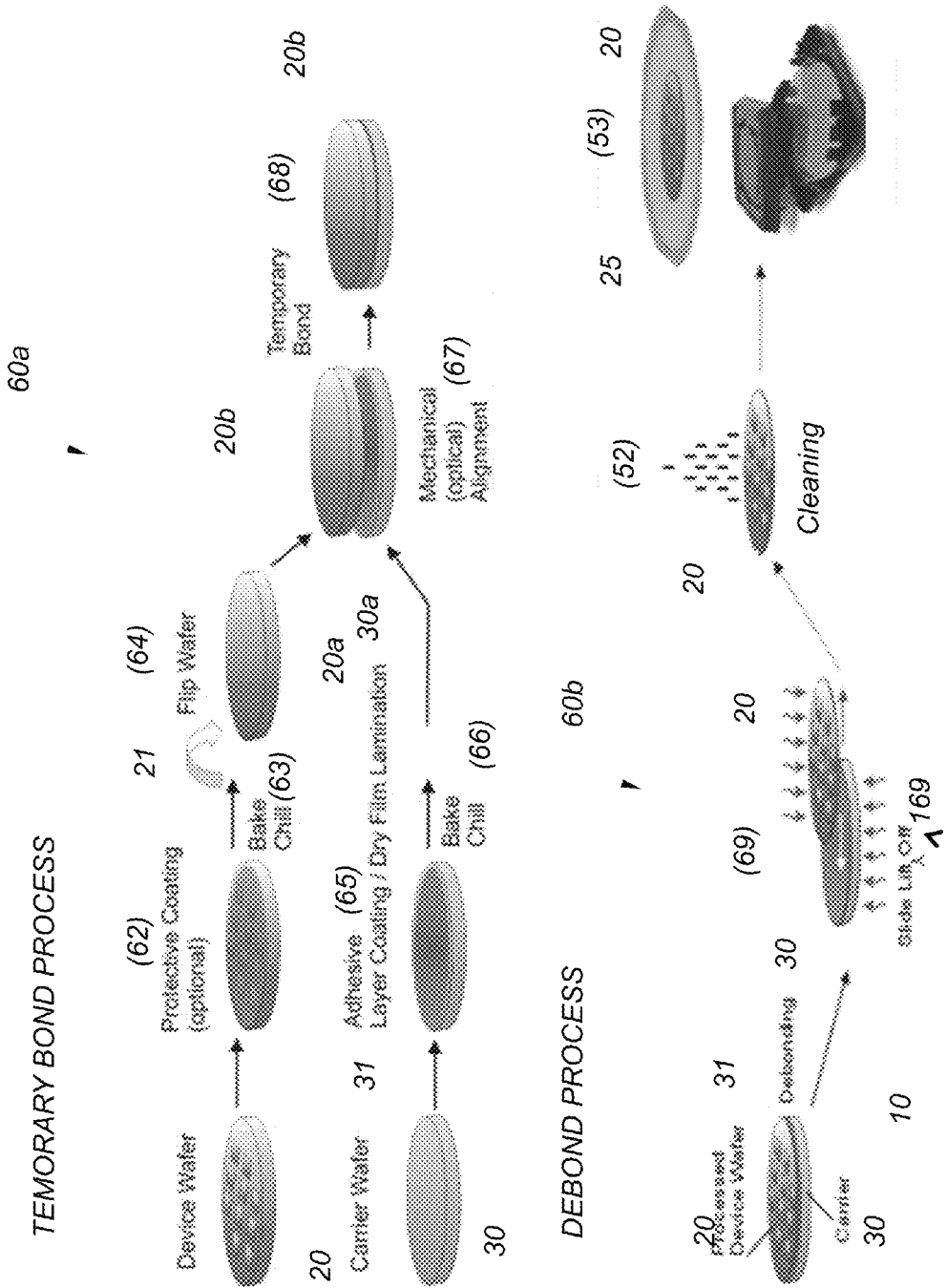
FIG. 1A is a schematic diagram of temporary wafer bonding process A and debonding process A performed in bonder 210 and debonder 150' of FIG. 1, respectively.

Referring to FIG. 1A, temporary bond process 60a includes the following steps. First, device wafer 20 is coated with a protective coating 21 (62), the coating is then baked and chilled (63) and then the wafer is flipped (64). A carrier wafer 30 is coated with an adhesive layer 31 (65) and then the coating is baked and chilled (66). In other embodiments, a dry adhesive film is laminated onto the carrier wafer, instead of coating an adhesive layer. Next, the flipped device wafer 20 is aligned with the carrier wafer 30 so that the surface of the device wafer with the protective coating 20a is opposite to the surface of the carrier wafer with the adhesive layer 30a (67) and then the two wafers are bonded (68) in the temporary bonder module 210, shown in FIG. 1B. The bond is a temporary bond between the protective layer 21 and the adhesive layer 31. In other embodiments, no protective coating is applied onto the device wafer surface and the device wafer surface 20a is directly bonded with the adhesive layer 31. Examples of device wafers include GaAs wafers, silicon wafers, or any other semiconductor wafer that needs to be thinned down to less than 100 micrometers. These thin wafers are used in military and telecommunication applications for the fabrication of power amplifiers or other power devices where good heat removal and small power factor are desirable. The carrier wafer 30 is usually made of a non-contaminating material that is thermally matched with the device wafer, i.e., has the same coefficient of thermal expansion (CTE). Examples of carrier wafer materials include silicon, glass, sapphire, quartz or other semiconductor materials. The diameter of the carrier wafer 30 is usually the same as or slightly larger than the diameter of the device wafer 20, in order to support the device wafer edge and prevent cracking or chipping of the device wafer edge. In one example, the carrier wafer thickness is about 1000 micrometers and the total thickness variation (TTV) is 2-3 micrometers. Carrier wafers are recycled and reused after they are debonded from the device wafer. In one example, adhesive layer 31 is an organic adhesive WaferBOND™ HT-10.10, manufactured by Brewer Science, Missouri, USA. Adhesive 31 is applied via a spin-on process and has a thickness in the range of 9 to 25 micrometers. The spin speed is in the rage of 1000 to 2500 rpm and the spin time is between 3-60 second. After the spin-on application, the adhesive layer is baked for 2 min at a temperature between 100° C. to 150° C. and then cured for 1-3 minutes at a temperature between 160° C. to 220° C. WaferBOND™ HT-10.10 layer is optically transparent and is stable up to 220° C. The bonded wafer stack 10 is placed in a thinning module 120. After the thinning 120 of the exposed device wafer surface 20b the carrier wafer 30 is debonded via the debond process 60b, shown in FIG. 1A. Debond process 60b, includes the following steps. First heating the wafer stack 10 until the adhesive layer 31 softens and the carrier wafer 30 slides off from the thinned wafer (69). The Wafer-BOND™ HT-10.10 debonding time is less than 5 minutes. The thinned wafer 20 is then moved to a cleaning station 170 where any adhesive residue is stripped away (52) and then the thinned wafer 20 is moved to a taping station 180 placed in a dicing frame 25 (53).

Figure 1:
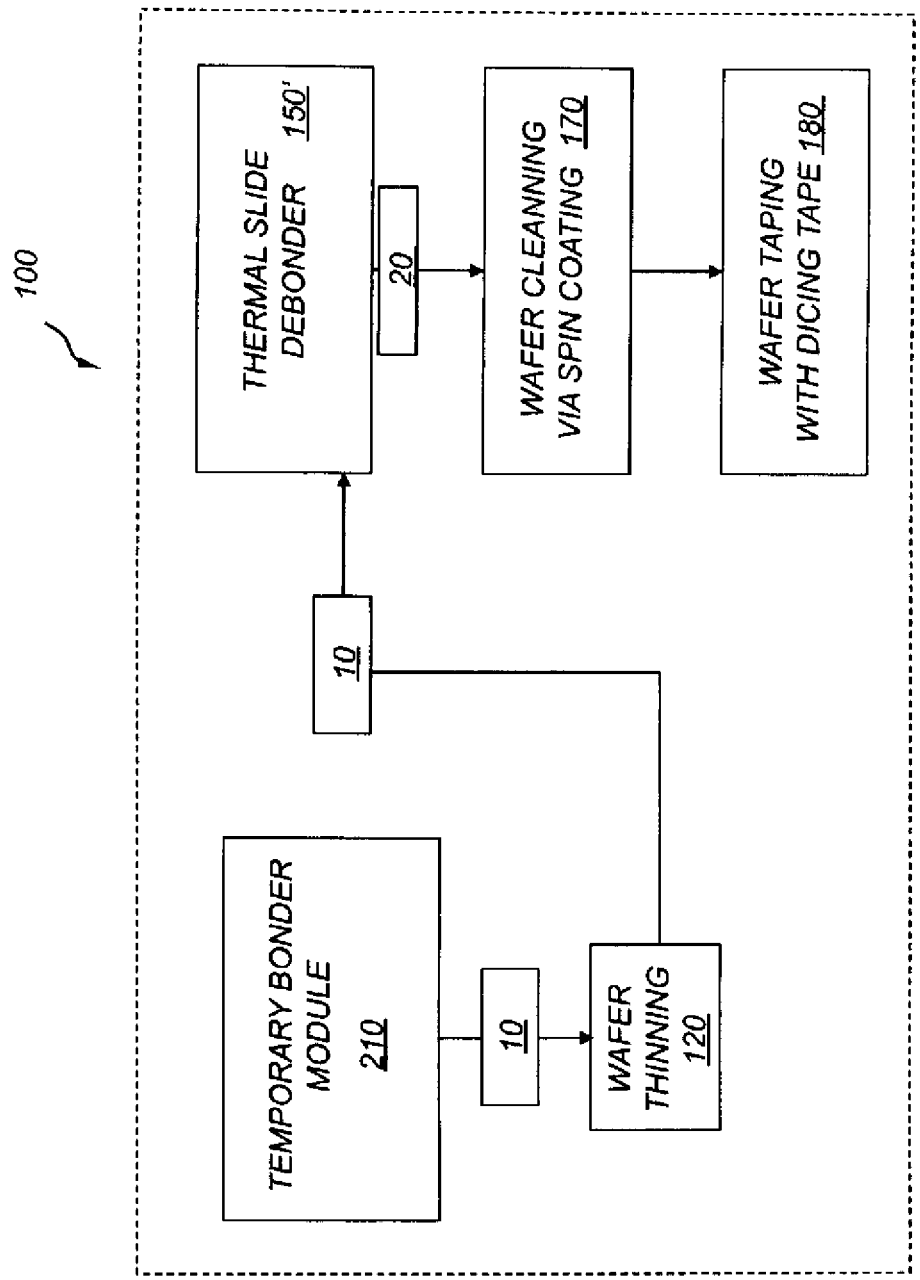
Figure 1A:
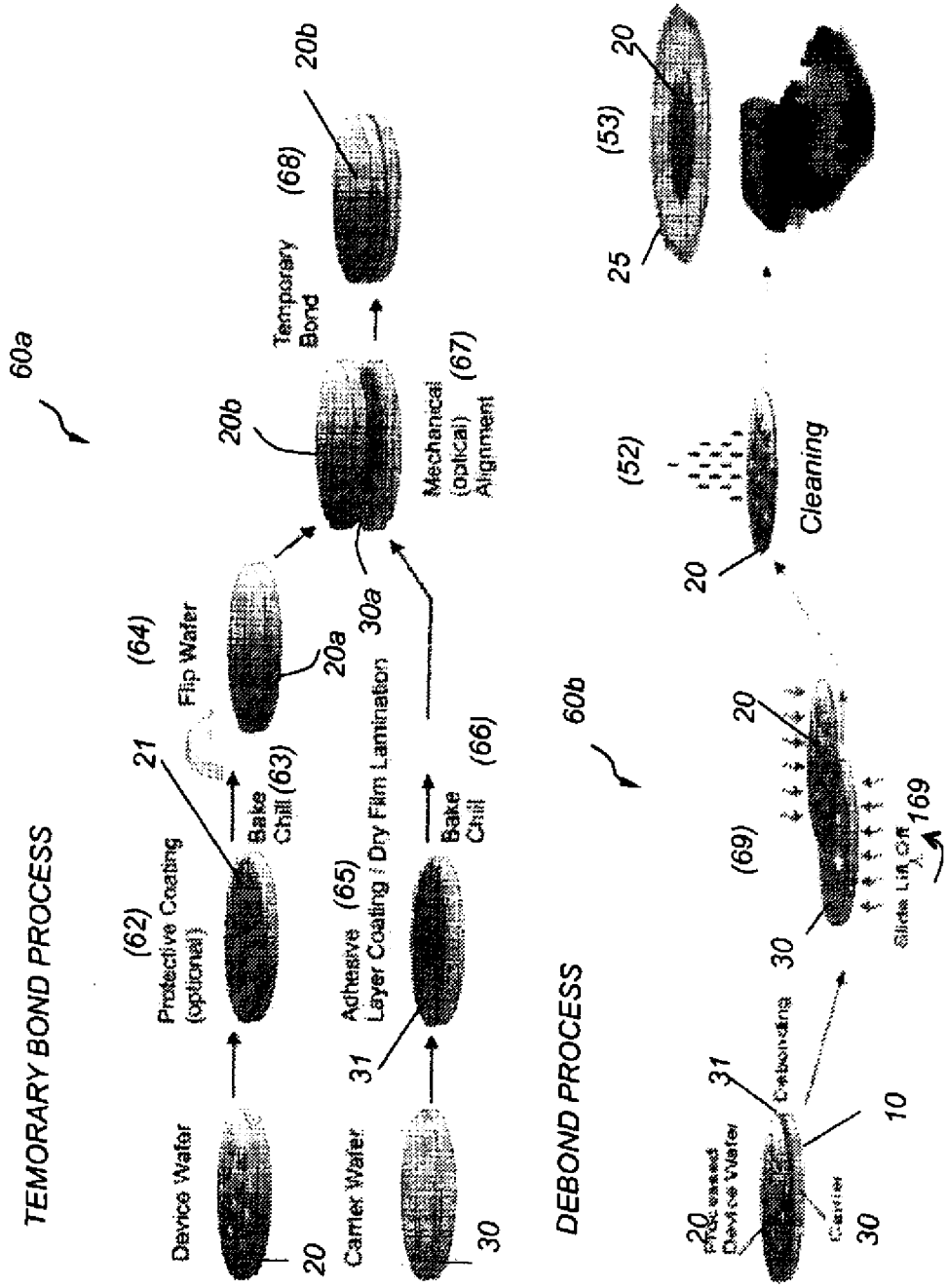
Figure 1B:
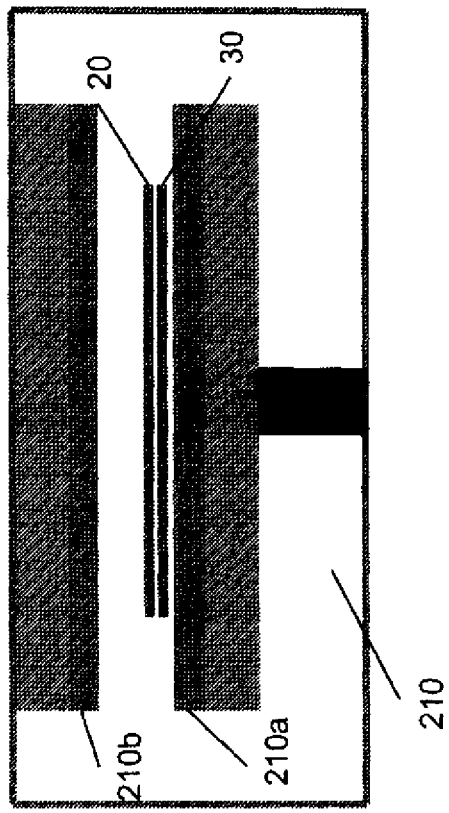
FIG. 1B depicts a schematic cross-sectional view of the temporary bonder 210 of FIG. 1 and a list of the process steps for performing the temporary wafer bonding process 60a of FIG. 1A.
Figure 2:
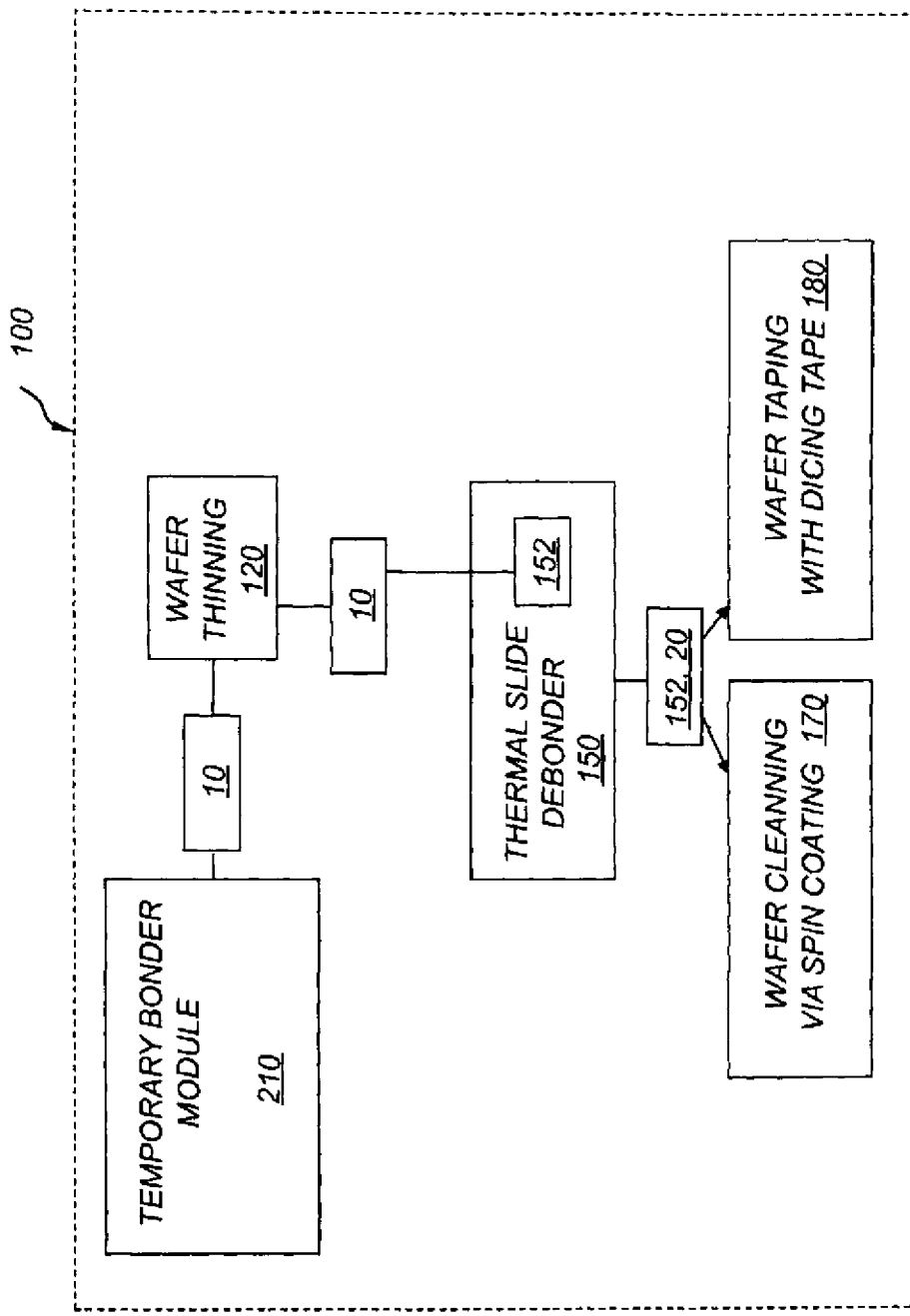
Figure 2A:
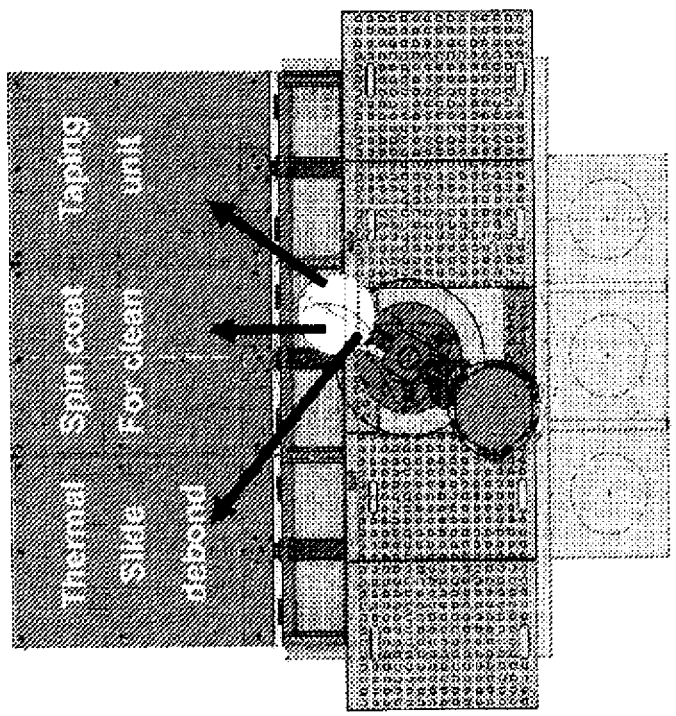
Figure 3:
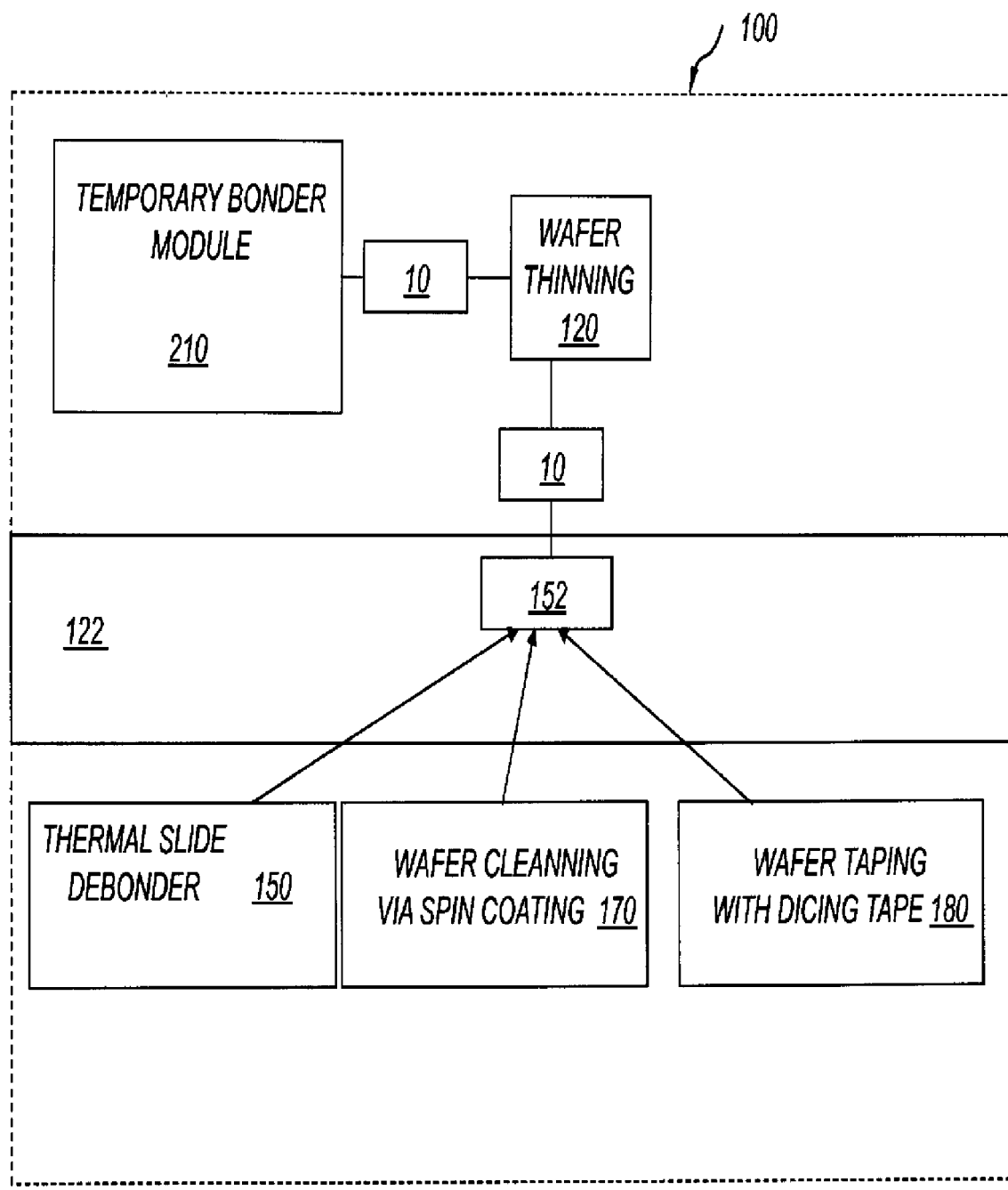
Figure 3A:
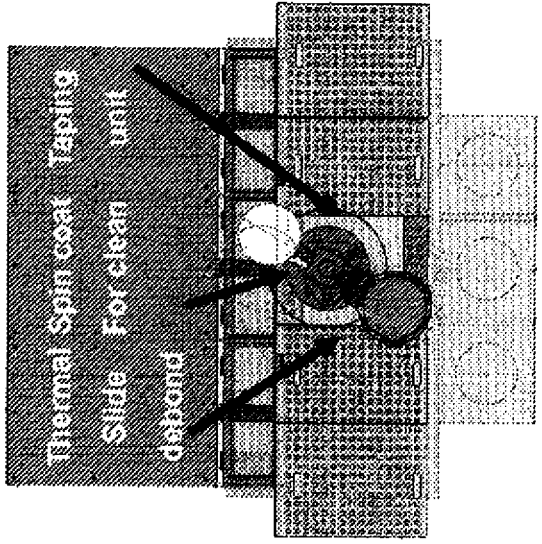
Figure 4:
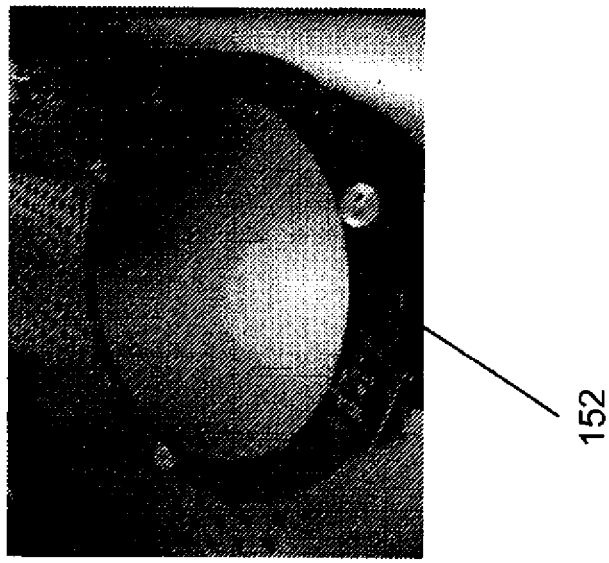
Figure 5:
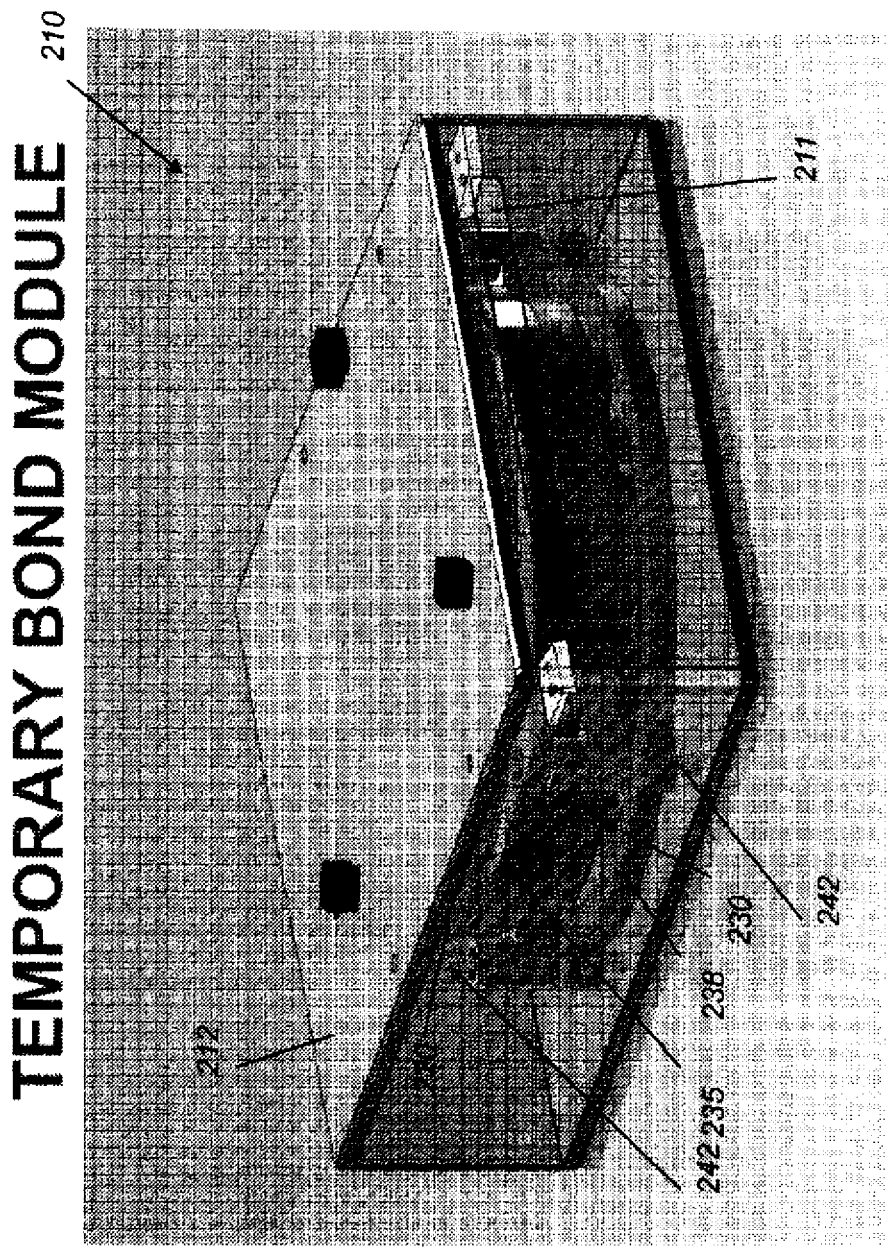
Figure 6:
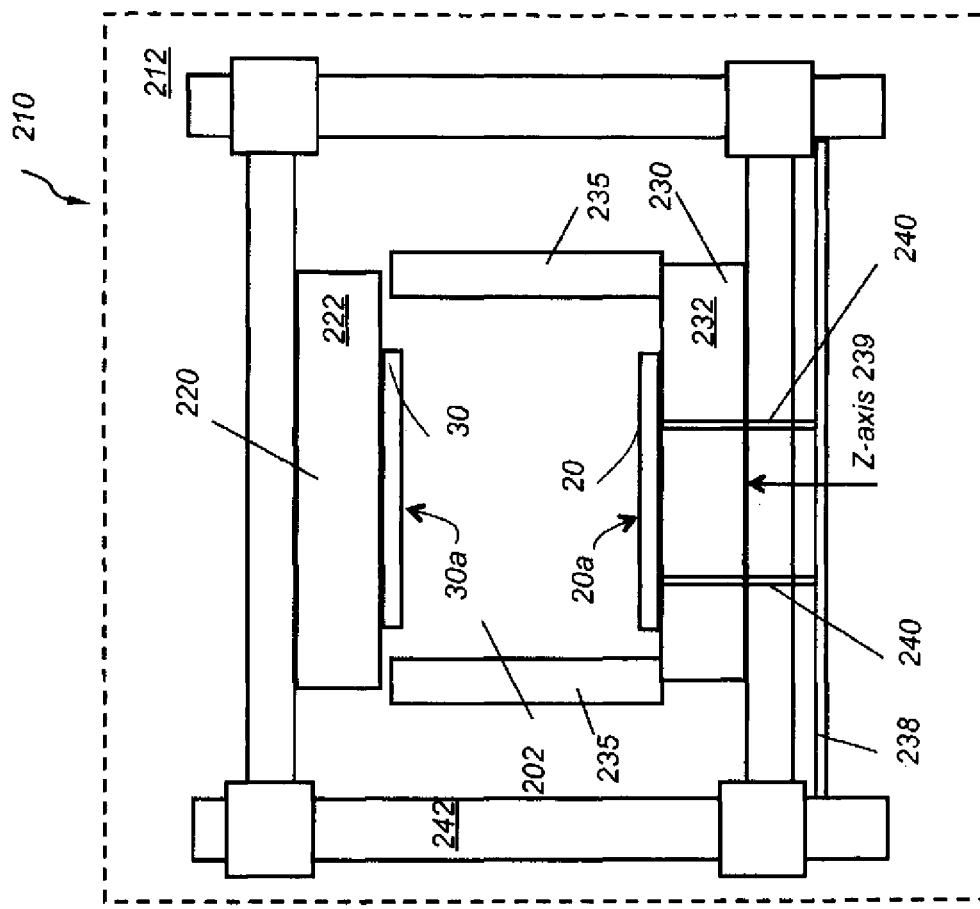
FIG. 6 depicts a schematic cross-sectional schematic view of the temporary wafer bonder of FIG. 5.
Figure 7:
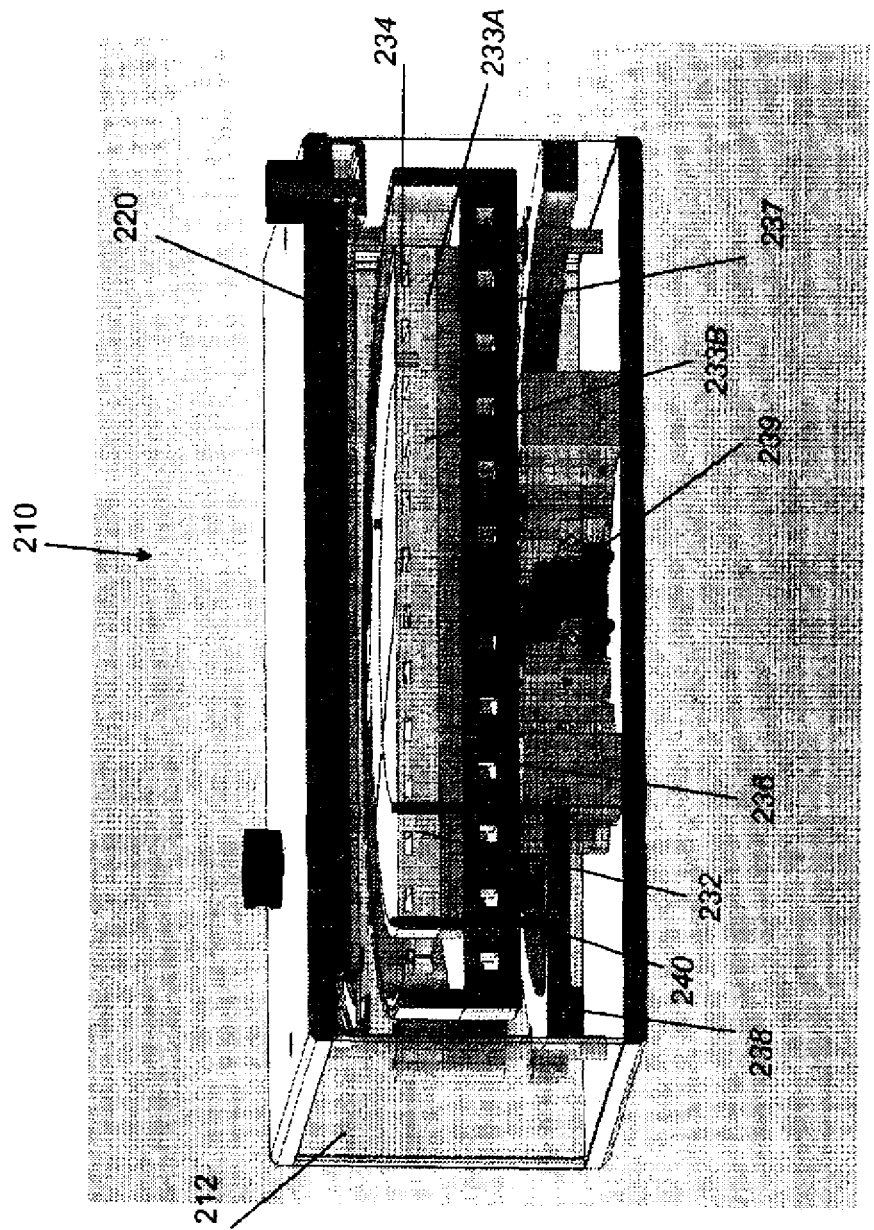
Figure 8:
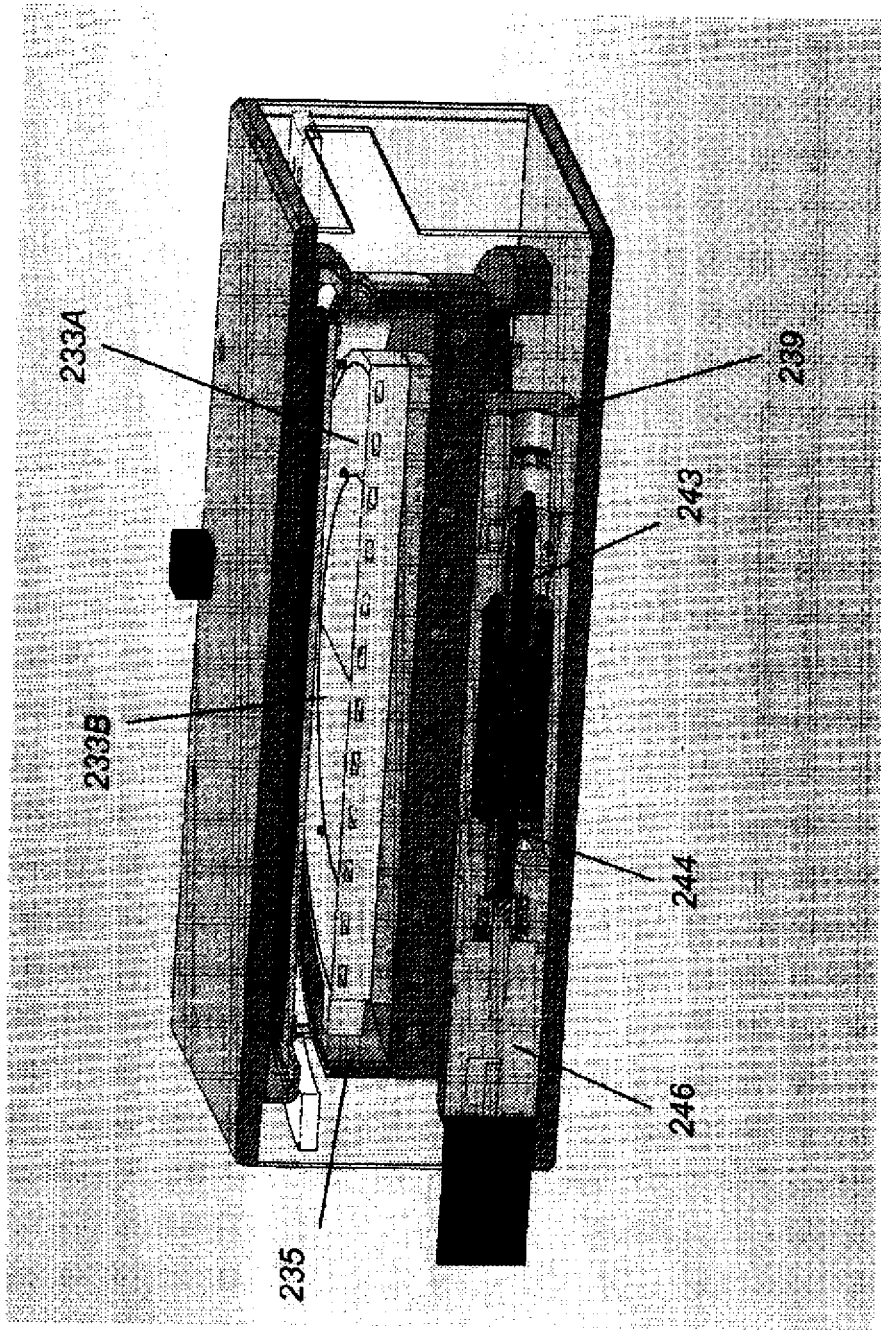
Figure 9:
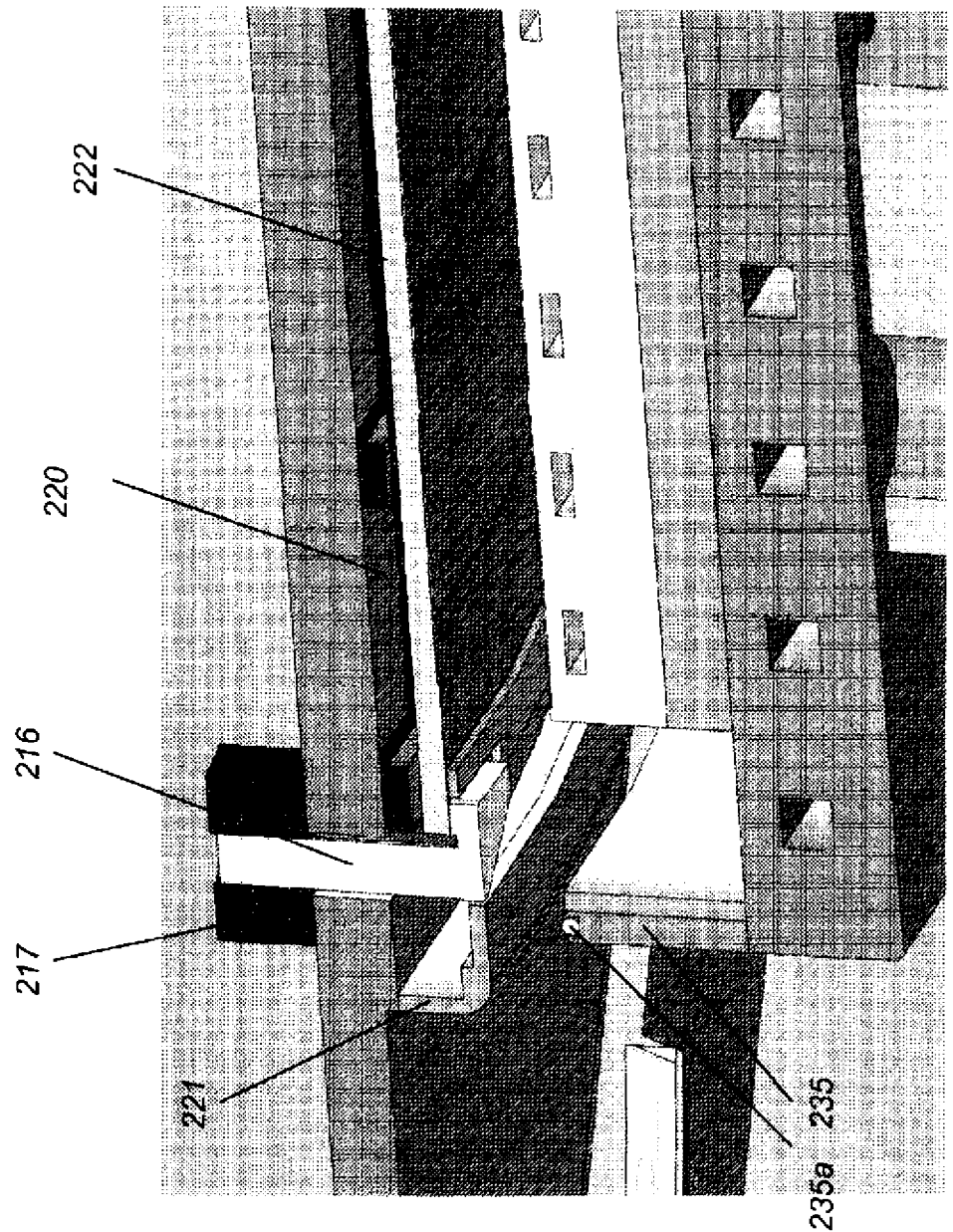
Figure 10:
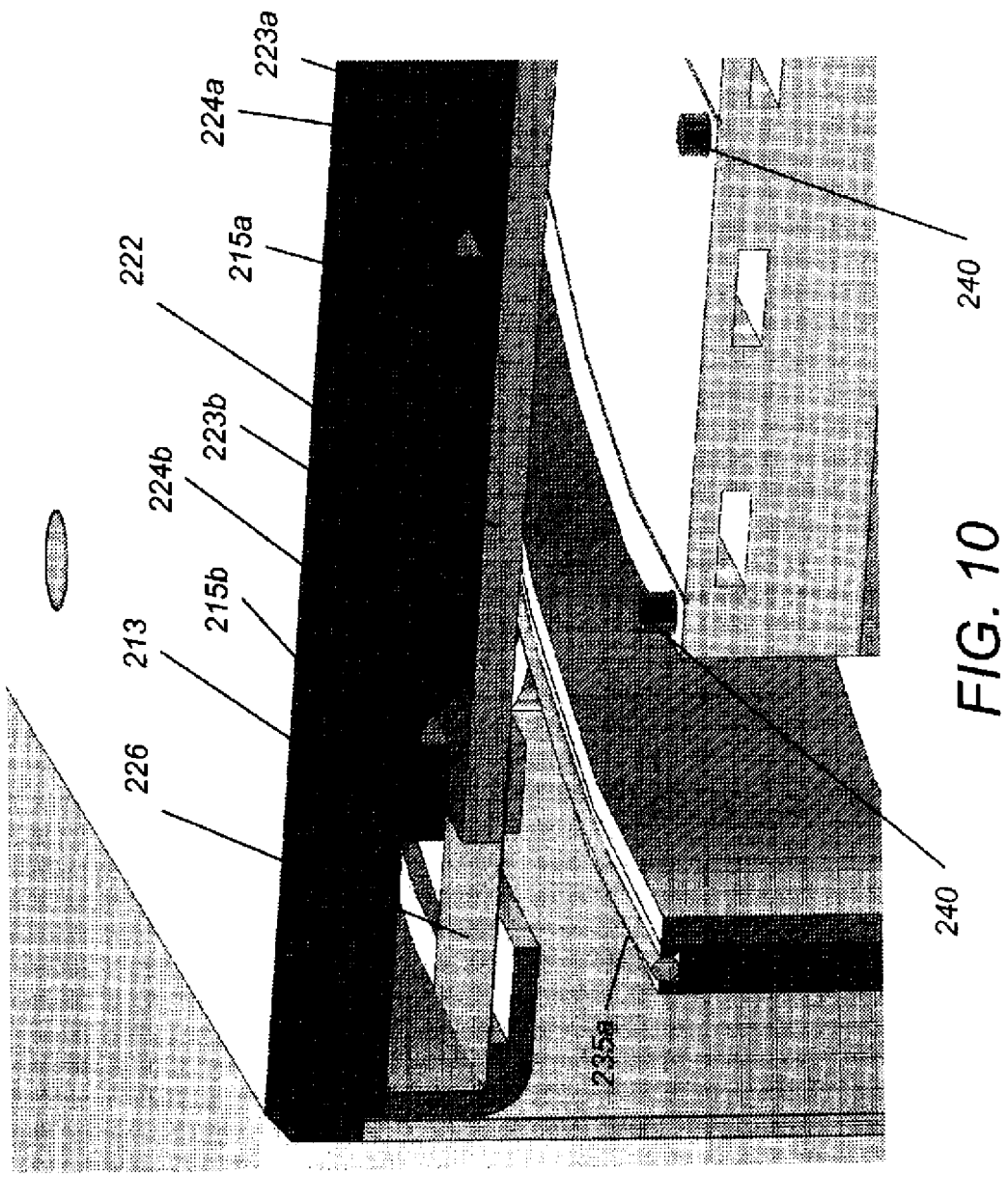
Figure 11:
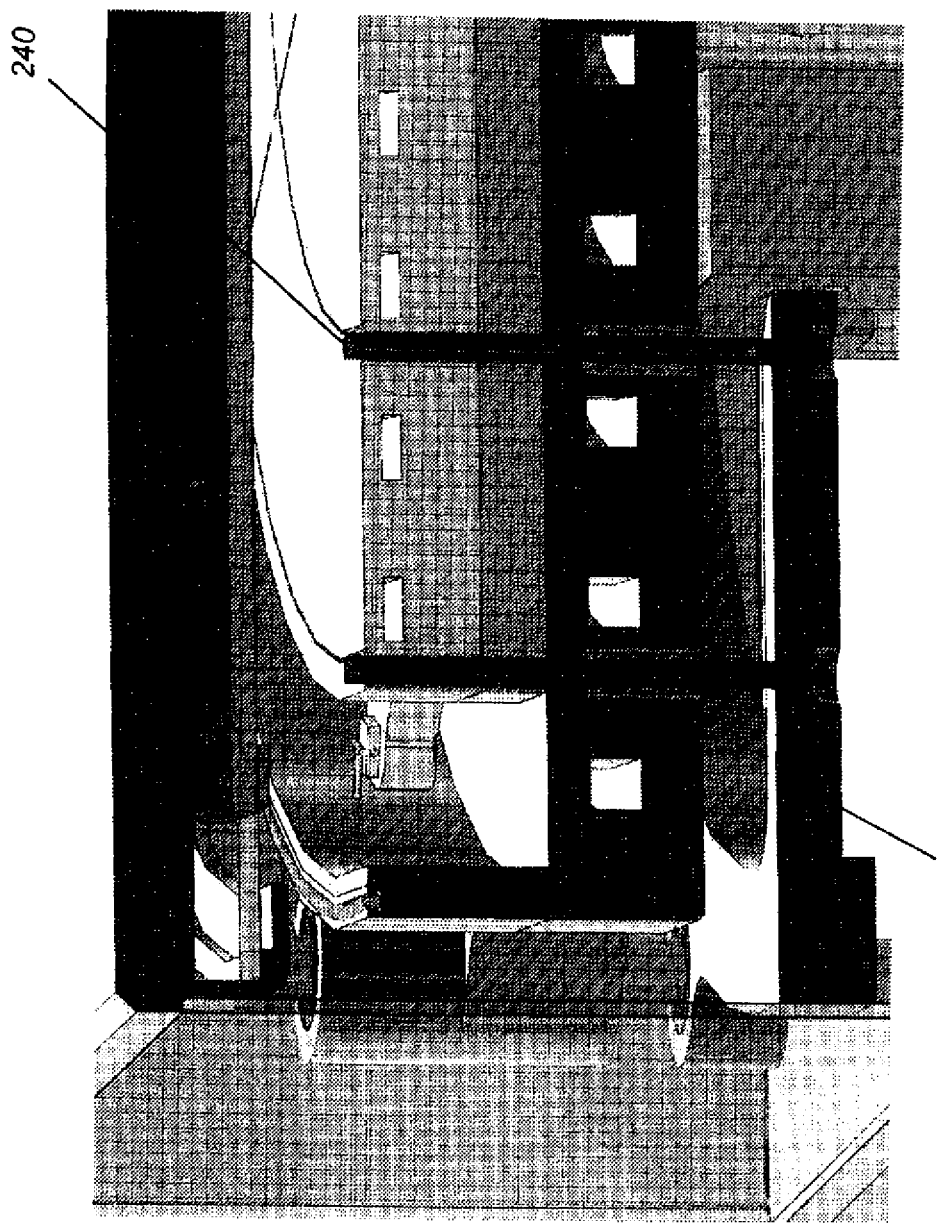
Figure 12:
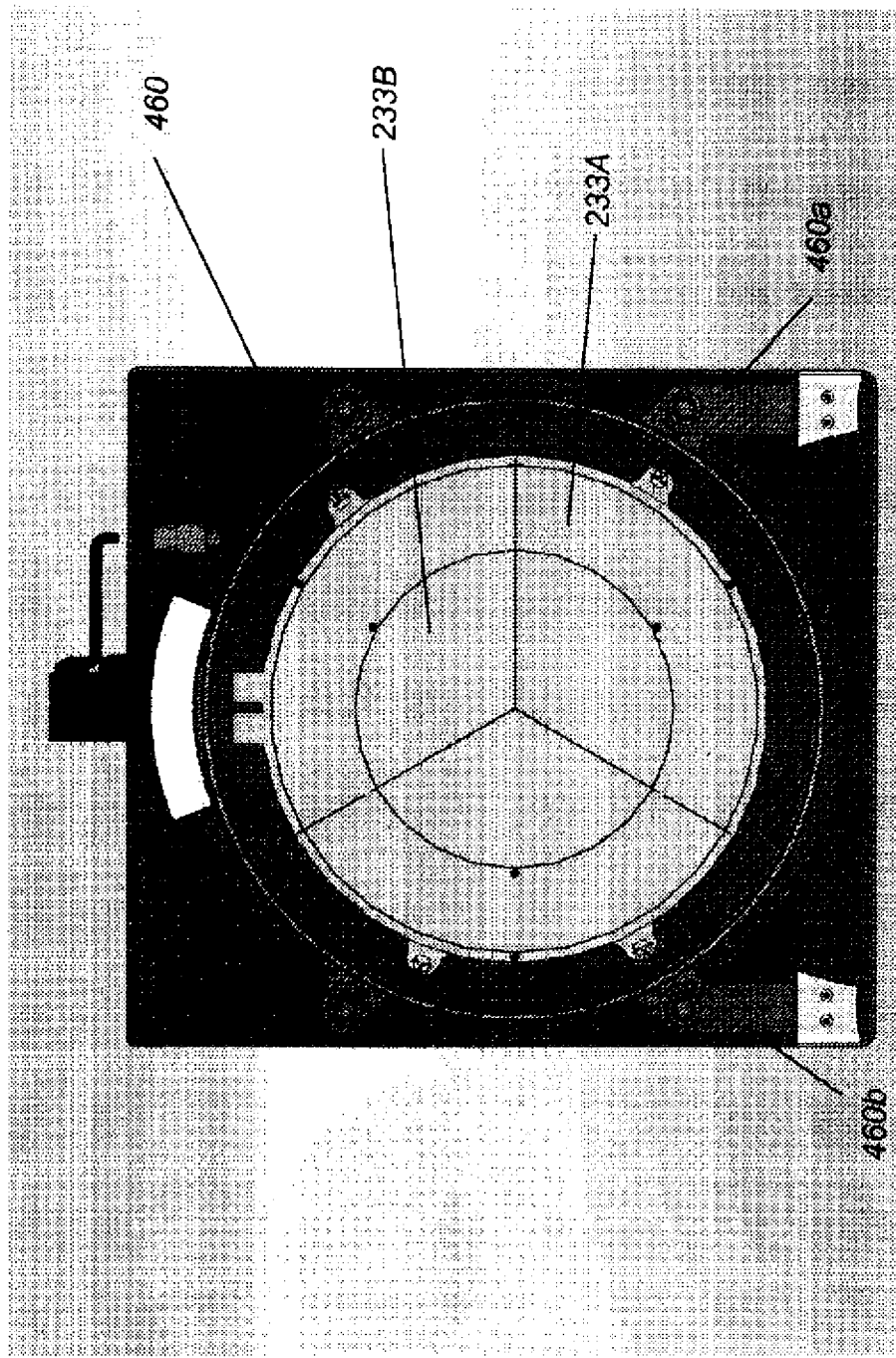
Figure 14:
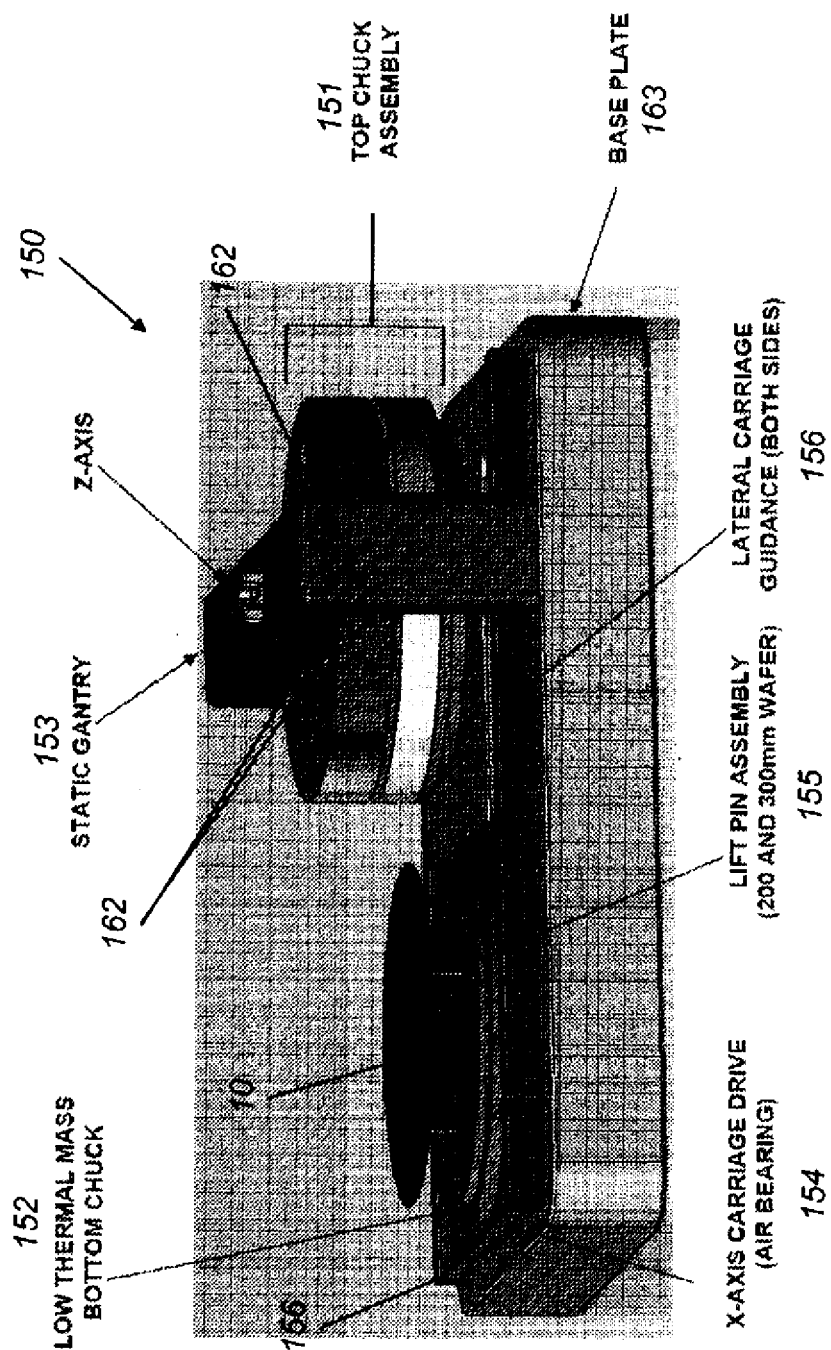
Figure 15:
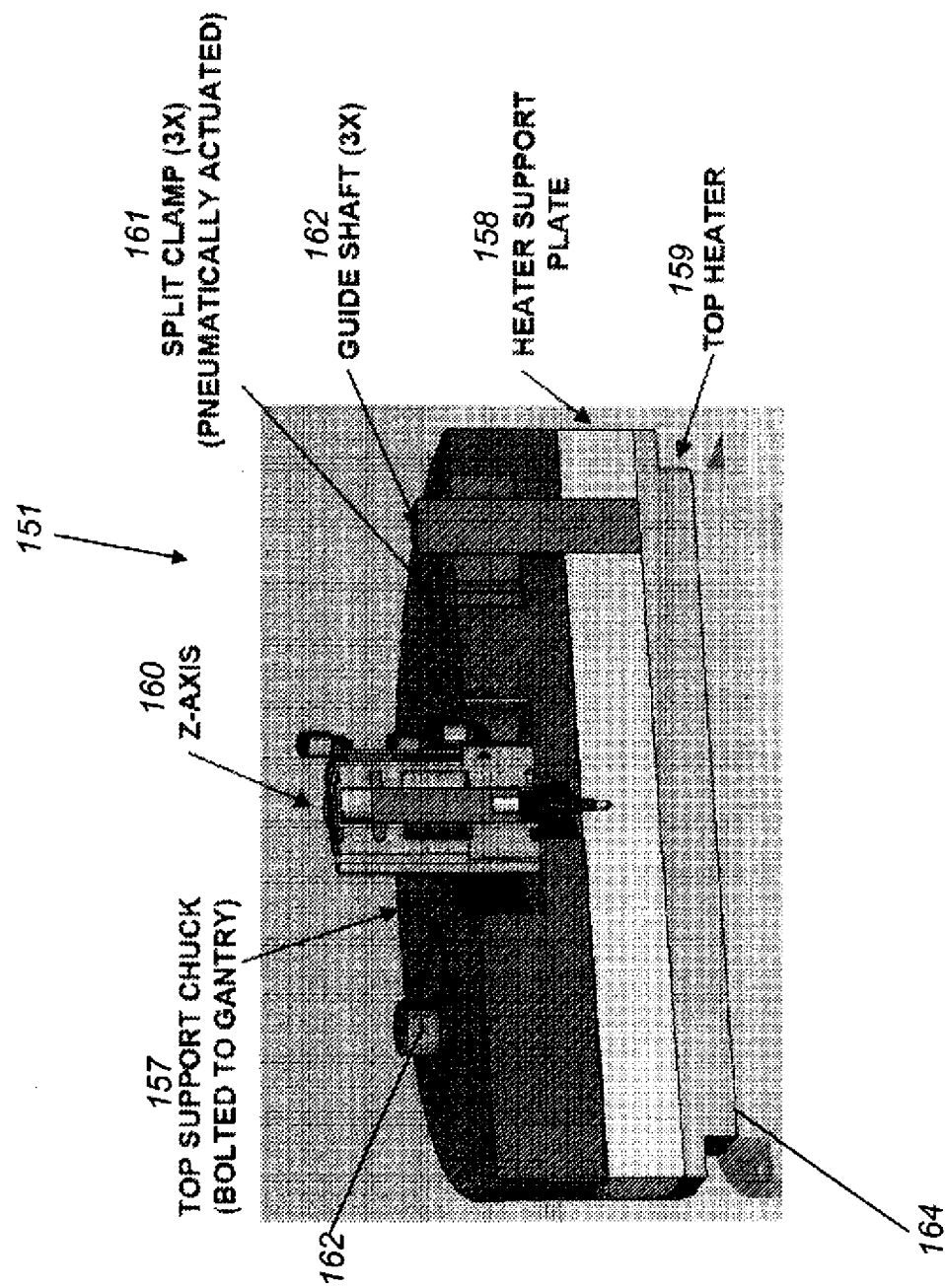
Figure 16:
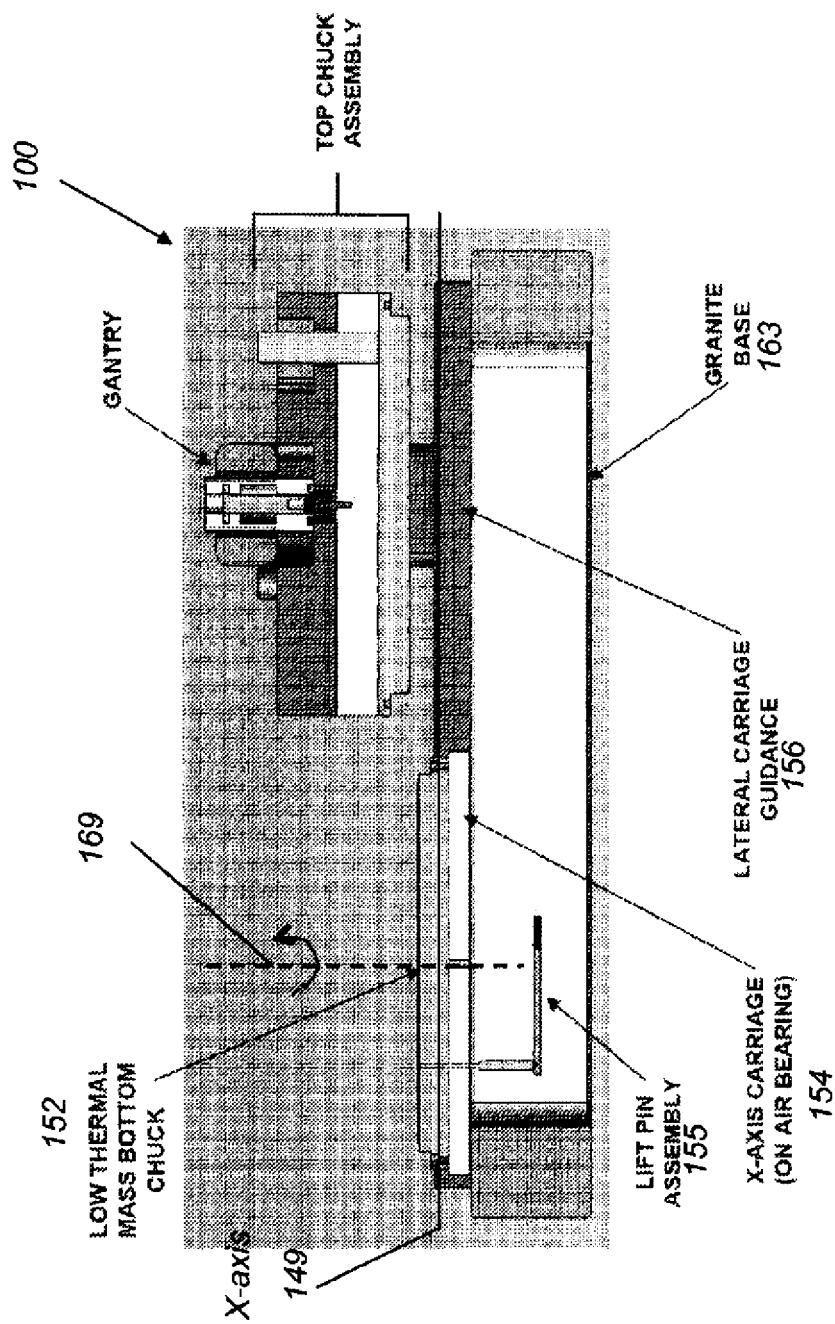
Figure 17A:
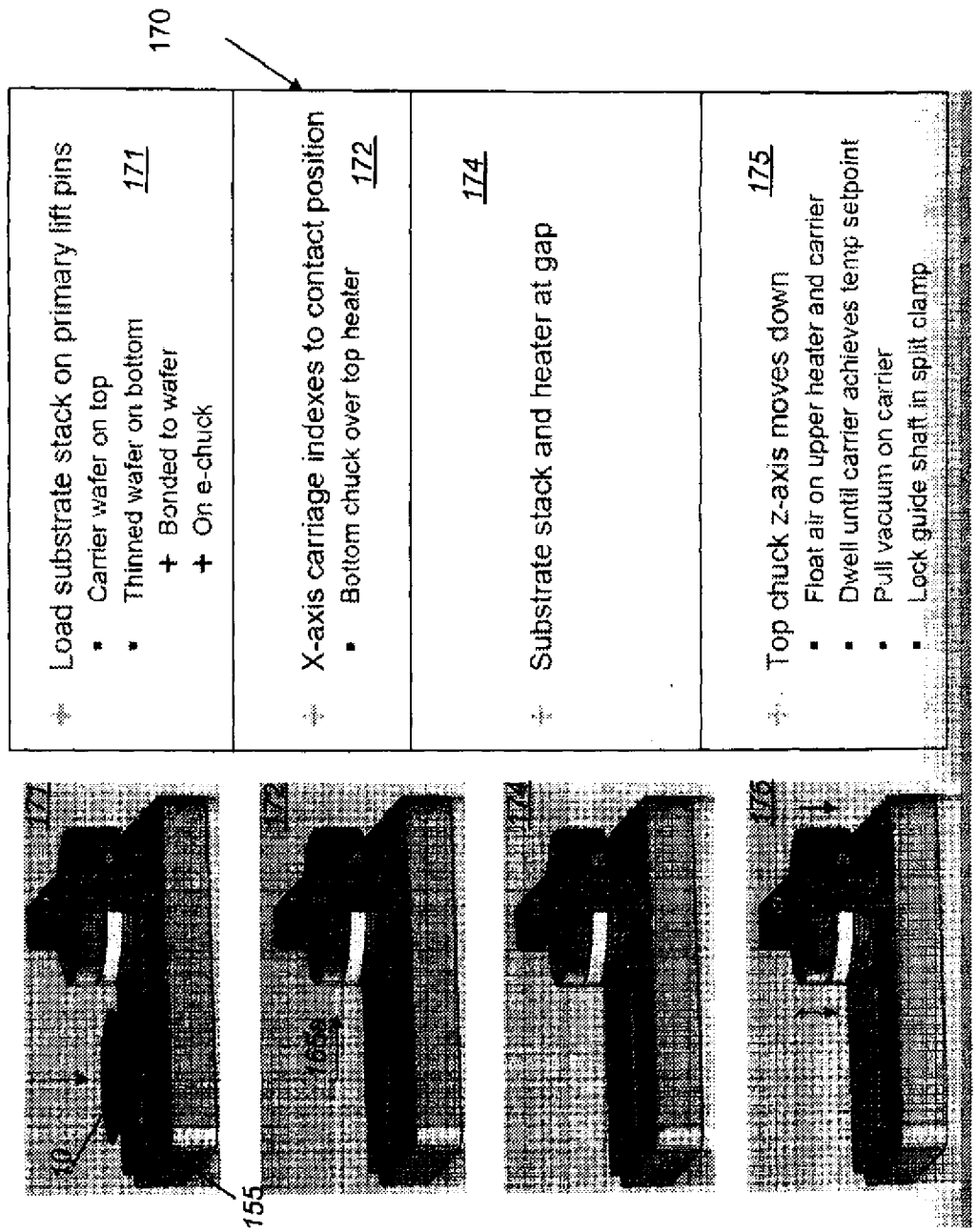
Figure 17B:
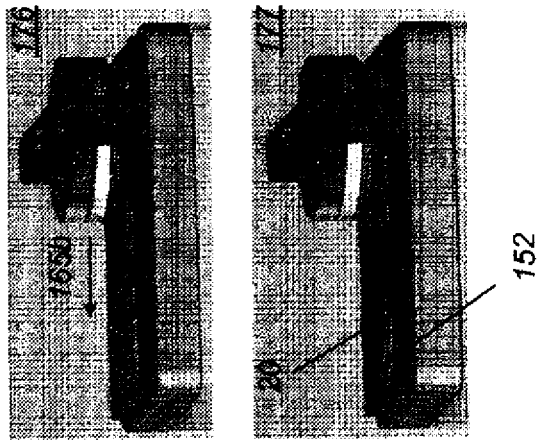

The temporary bonding (68) of the carrier wafer 30 to the device wafer 20 takes place in temporary bonder module, 210. Referring to FIG. 1B, the device wafer 20 is placed in a fixture chuck and the fixture chuck is loaded in the chamber 210. The carrier wafer 30 is placed with the adhesive layer facing up directly on the bottom chuck 210a and the two wafers 20, 30 are stacked and aligned. The top chuck 210b is lowered down onto the stacked wafers and a low force is applied. The chamber is evacuated and the temperature is raised to 200° C. for the formation of the bond between the protective coating layer 21 and the adhesive layer 31. Next, the chamber is cooled and the fixture with the bonded wafer stack 10 is unloaded.

The debond process 60b is a thermal slide debond process and includes the following steps, shown in FIG. 1A. The bonded wafer stack 10 is heated causing the adhesive layer 31 to become soft. The carrier wafer is then twisted around axis 169 and then slid off the wafer stack under controlled applied force and velocity (69). The separated device wafer 20 is then moved into the cleaning station 170 and cleaned (52) and then it is moved into the taping station 180 where it is mounted onto a dicing frame 25 (53).

In cases where the thinned device wafer is thicker than about 100 micrometers usually no additional support is needed for moving the thinned wafer 20 from the thermal slide debonder 150 to the further processing stations 170, 180. However, in cases where the thinned device wafer 20 is thinner than 100 micrometers a secondary support mechanism is required to prevent breaking or cracking of the thinned device wafer. Currently, the secondary support mechanism includes an electrostatic carrier or a carrier comprising a Gelpak™ acrylic film on a specially constructed wafer. As was mentioned above, these secondary support mechanism add complications and cost to the process.

The present invention eliminates the need for a secondary carrier by allowing a vacuum chuck 152 used in the thermal slide debonder 150 to remain with the thinned wafer 20 during the follow up processes steps of cleaning (52) and mounting onto a dicing tape (53). In one embodiment the thinned wafer 20 remains onto the vacuum chuck 152 and is moved with the vacuum chuck into the various process stations. In another embodiment the thinned wafer 20 remains onto the vacuum chuck 152 and the various process stations 170, 180 move over the thinned wafer 20 to perform the various process steps.

Figure 2:
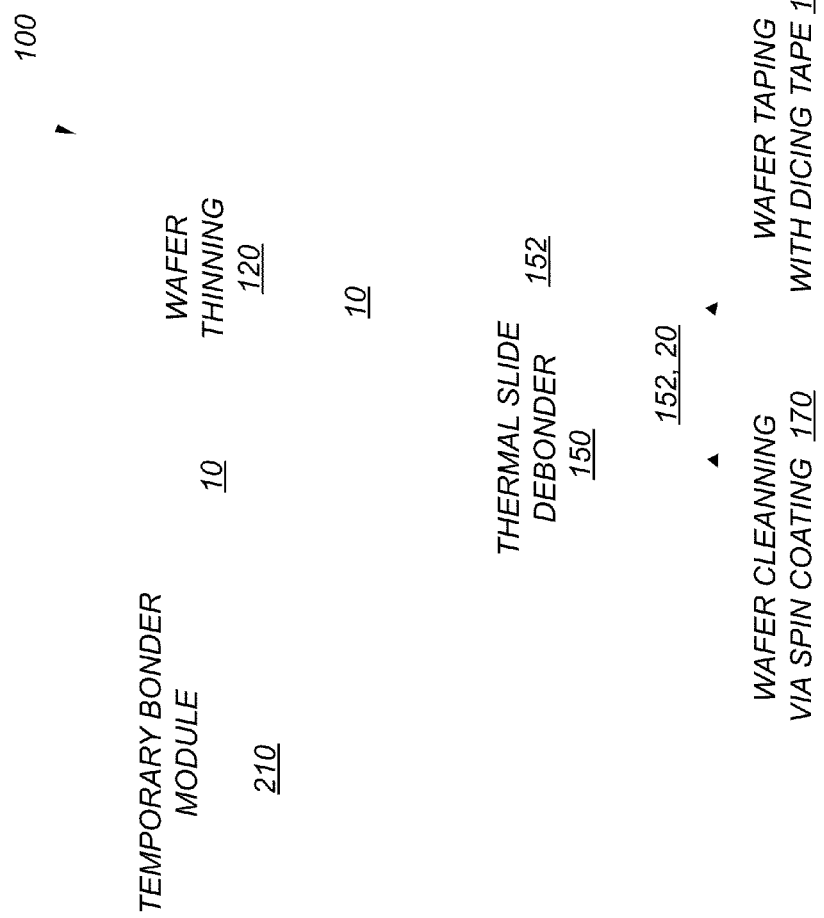
FIG. 2 and FIG. 2A are overview diagrams of one embodiment of the temporary wafer bonder system with an automated thermal slide debonder 150 of this invention where chuck 152 moves from station to station.
Figure 2A:
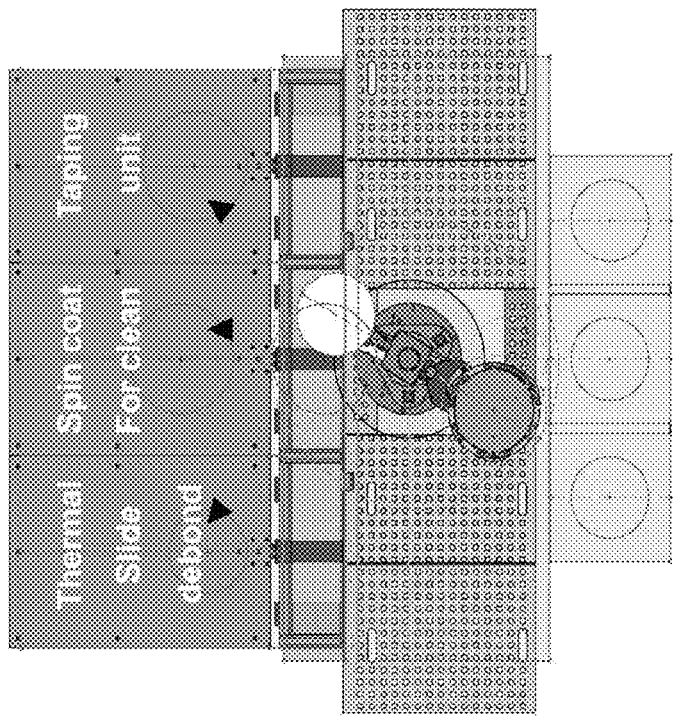
Figure 4:
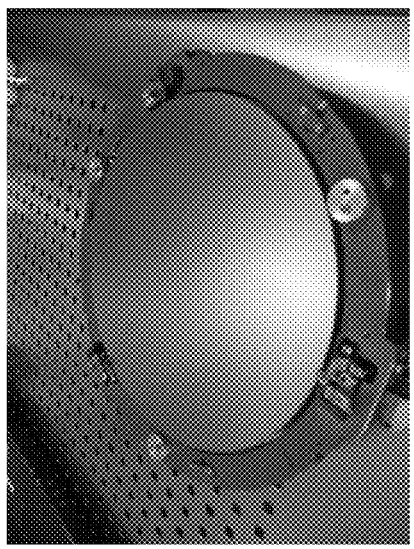
FIG. 4 depicts a view of chuck 152 of FIG. 2.
Figure 5:
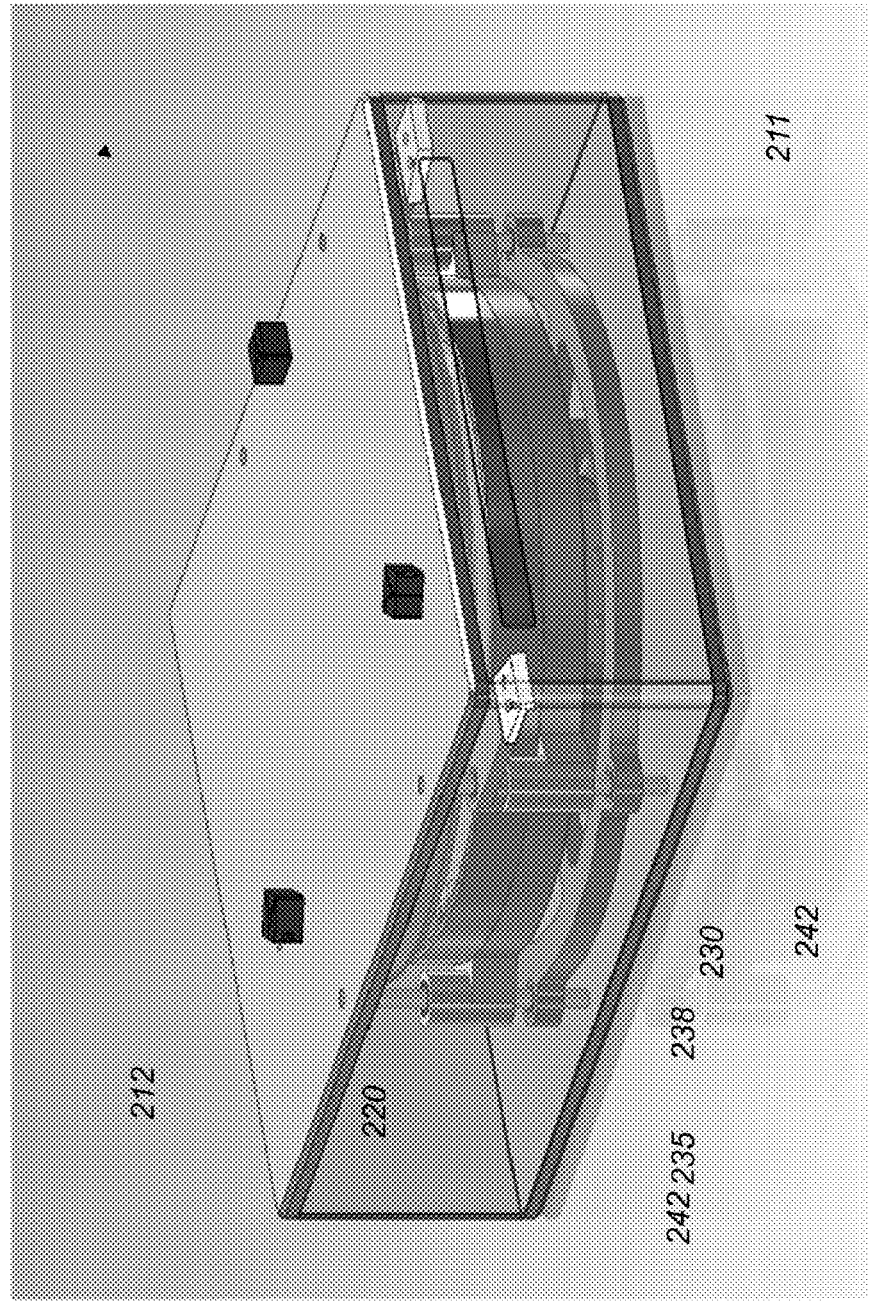
FIG. 5 depicts the temporary wafer bonder 210 of FIG. 2.

Referring to FIG. 2 and FIG. 2A, the bonded wafer pair 10 is loaded into the vacuum chuck 152 (shown in FIG. 4 and FIG. 14) of debonder 150 and the thermal debonding process 60b is applied. The vacuum chuck 152 with the debonded device wafer 20 moves into the cleaning station 170 where a solvent is used to clean the residual adhesive off the wafer via a spin cleaning technique. Next, the chuck 152 with the cleaned device wafer 20 moves to the taping station 180 where a tape/frame assembly is attached to the thinned device wafer 20 surface. Finally, the taped thinned wafer 20 is moved to a cassette and the carrier wafer 30 is moved to a different cassette.

Figure 3:
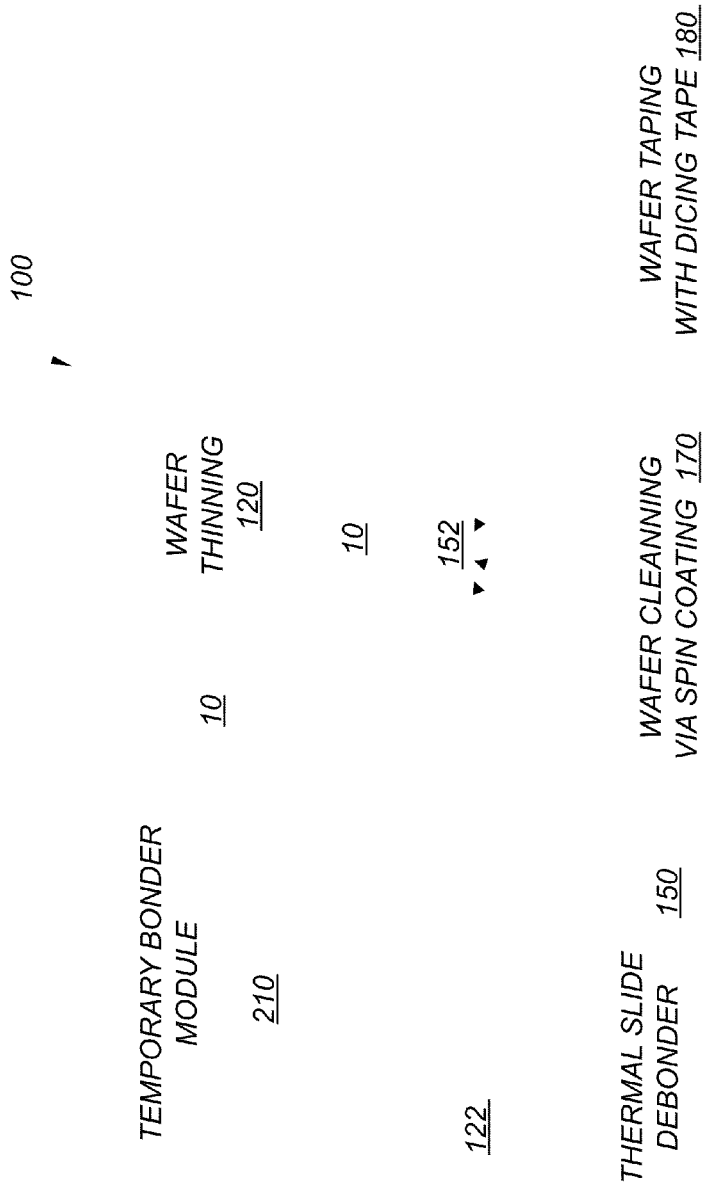
FIG. 3 and FIG. 3A are overview diagrams of another embodiment of the automated thermal slide debonder 150 of this invention where the various process stations move over chuck 152.
Figure 3A:
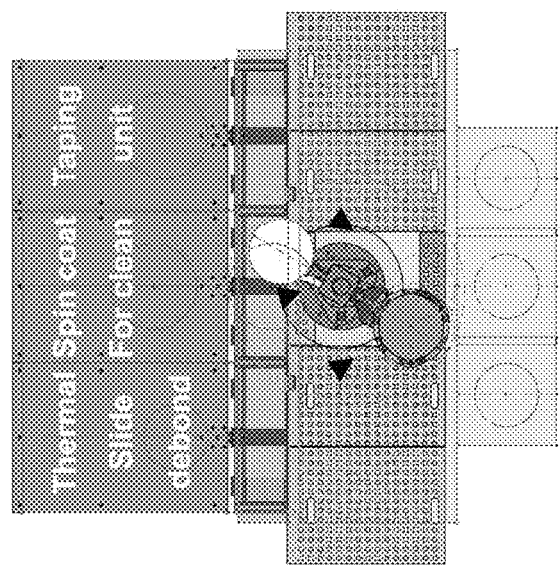

Referring to FIG. 3 and FIG. 3A, in another embodiment, the thinned wafer stack 10 is placed in the vacuum chuck 152 and the chuck 152 is loaded in a chamber 122. Next, thermal slide debonder 150 moves into position over the vacuum chuck 152 with the bonded wafer pair 10 and performs the thermal debonding process 60b. Next, the thermal slide debonder 150 moves out of the chamber 122 and the cleaning module 170 moves into the chamber 122 and cleans the residual adhesive off the device wafer 20. Once the cleaning step is completed, the cleaning module 170 is removed and the taping module 180 is moved over the thinned and cleaned device wafer 20 and applies the tape/frame assembly onto the device wafer 20. Finally, the taped thinned device wafer 20 is moved to a cassette and the carrier wafer 30 is moved to a different cassette.

Referring to FIG. 5-FIG. 11, temporary bond module 210 includes a housing 212 having a load door 211, an upper block assembly 220 and an opposing lower block assembly 230. The upper and lower block assemblies 220, 230 are movably connected to four Z-guide posts 242. In other embodiments, less than four or more than four Z-guide posts are used. A telescoping curtain seal 235 is disposed between the upper and lower block assemblies 220, 230. A temporary bonding chamber 202 is formed between the upper and lower assemblies 220, 230 and the telescoping curtain seal 235. The curtain seal 235 keeps many of the process components that are outside of the temporary bonding chamber area 202 insulated from the process chamber temperature, pressure, vacuum, and atmosphere. Process components outside of the chamber area 202 include guidance posts 242, Z-axis drive 243, illumination sources, mechanical pre-alignment arms 460a, 460b and wafer centering jaws 461a, 461b, among others. Curtain 235 also provides access to the bond chamber 202 from any radial direction.

Figure 7:
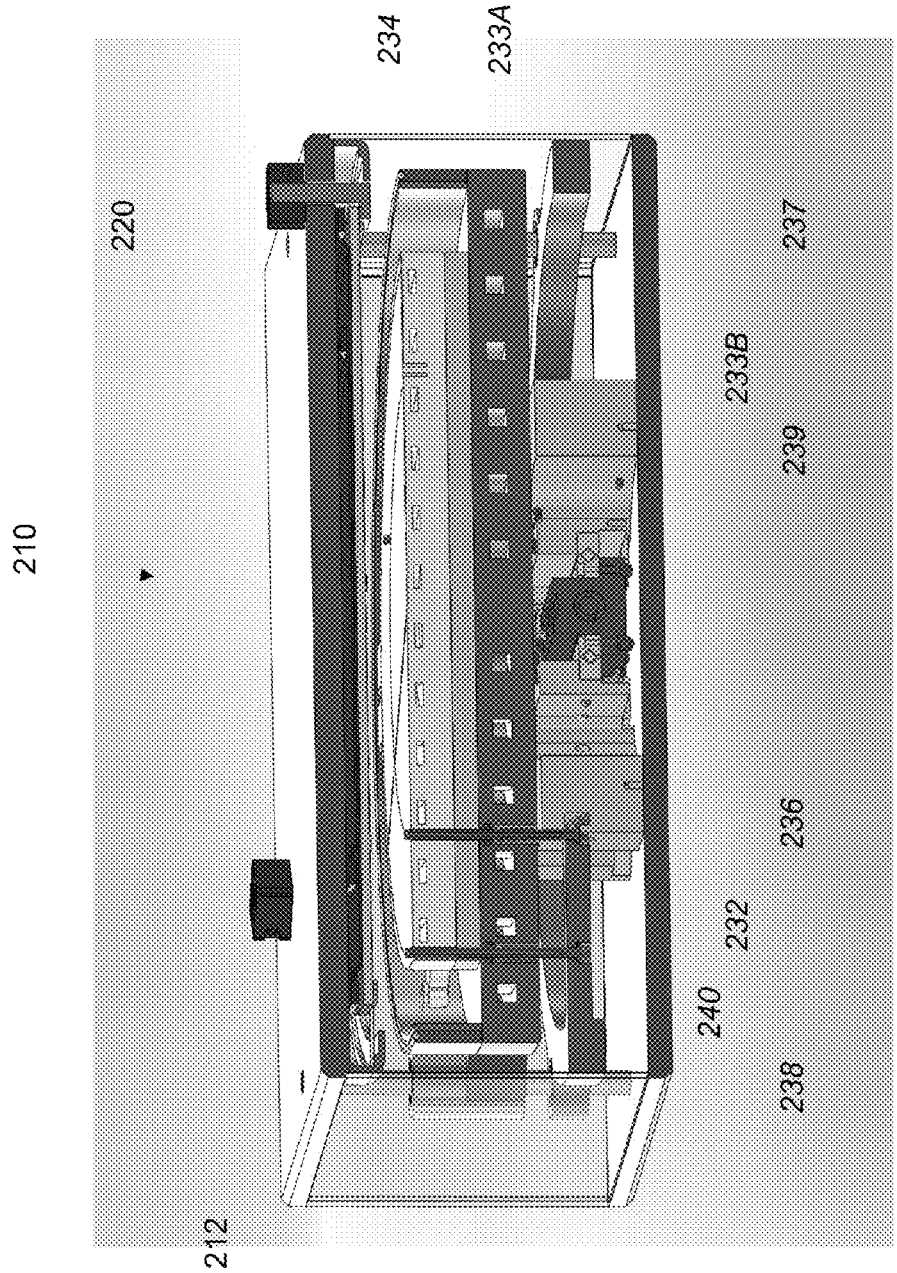
FIG. 7 depicts a cross-sectional view of the temporary wafer bonder of FIG. 5 perpendicular to the load direction.
Figure 8:
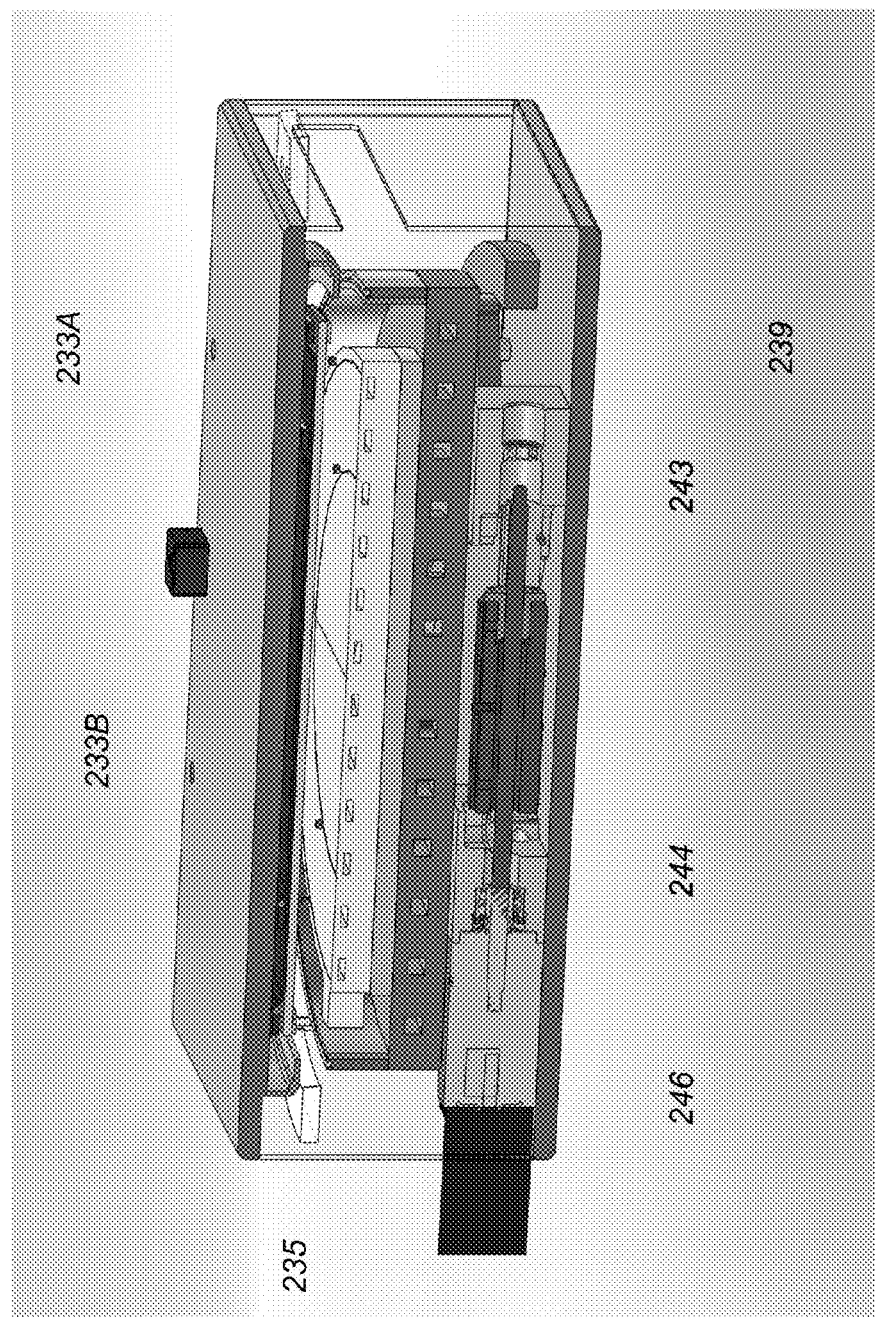
FIG. 8 depicts a cross-sectional view of the temporary wafer bonder of FIG. 5 in line with the load direction.
Figure 11:
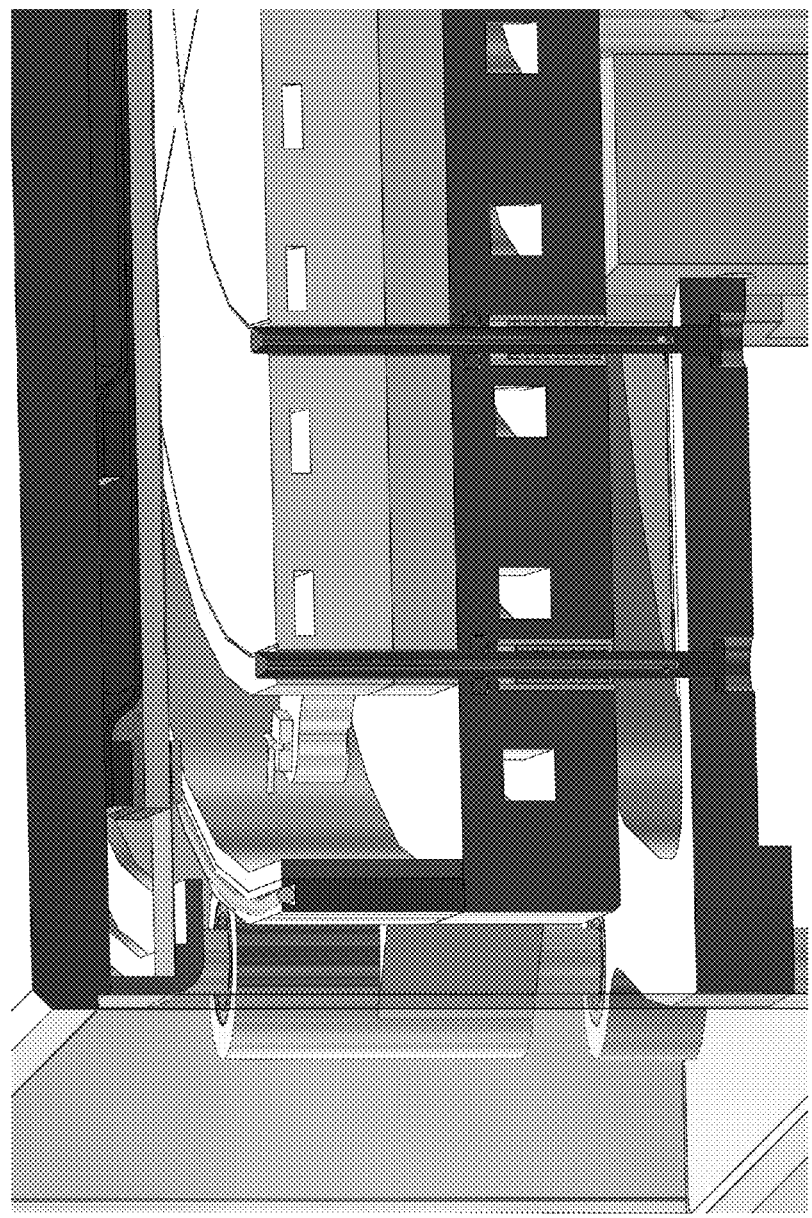
FIG. 11 depicts a detailed cross-sectional view of the temporary wafer bonder of FIG. 5.

Referring to FIG. 7, the lower block assembly 230 includes a heater plate 232 supporting the wafer 20, an insulation layer 236, a water cooled support flange 237 a transfer pin stage 238 and a Z-axis block 239. Heater plate 232 is a ceramic plate and includes resistive heater elements 233 and integrated air cooling 234. Heater elements 233 are arranged so the two different heating zones are formed. A first heating zone 233B is configured to heat a 200 mm wafer or the center region of a 300 mm wafer and a second heating zone 233A is configured to heat the periphery of the 300 mm wafer. Heating zone 233A is controlled independently from heating zone 233B in order to achieve thermal uniformity throughout the entire bond interface 405 and to mitigate thermal losses at the edges of the wafer stack. Heater plate 232 also includes two different vacuum zones for holding wafers of 200 mm and 300 mm, respectively. The water cooled thermal isolation support flange 237 is separated from the heater plate by the insulation layer 236. The transfer pin stage 238 is arranged below the lower block assembly 230 and is movable supported by the four posts 242. Transfer pin stage 238 supports transfer pins 240 arranged so that they can raise or lower different size wafers. In one example, the transfer pins 240 are arranged so that they can raise or lower 200 mm and 300 mm wafers. Transfer pins 240 are straight shafts and, in some embodiments, have a vacuum feed opening extending through their center, as shown in FIG. 11. Vacuum drawn through the transfer pin openings holds the supported wafers in place onto the transfer pins during movement and prevents misalignment of the wafers. The Z-axis block 239 includes a precision Z-axis drive 243 with ball screw, linear cam design, a linear encoder feedback 244 for submicron position control, and a servomotor 246 with a gearbox, shown in FIG. 8.

Figure 9:
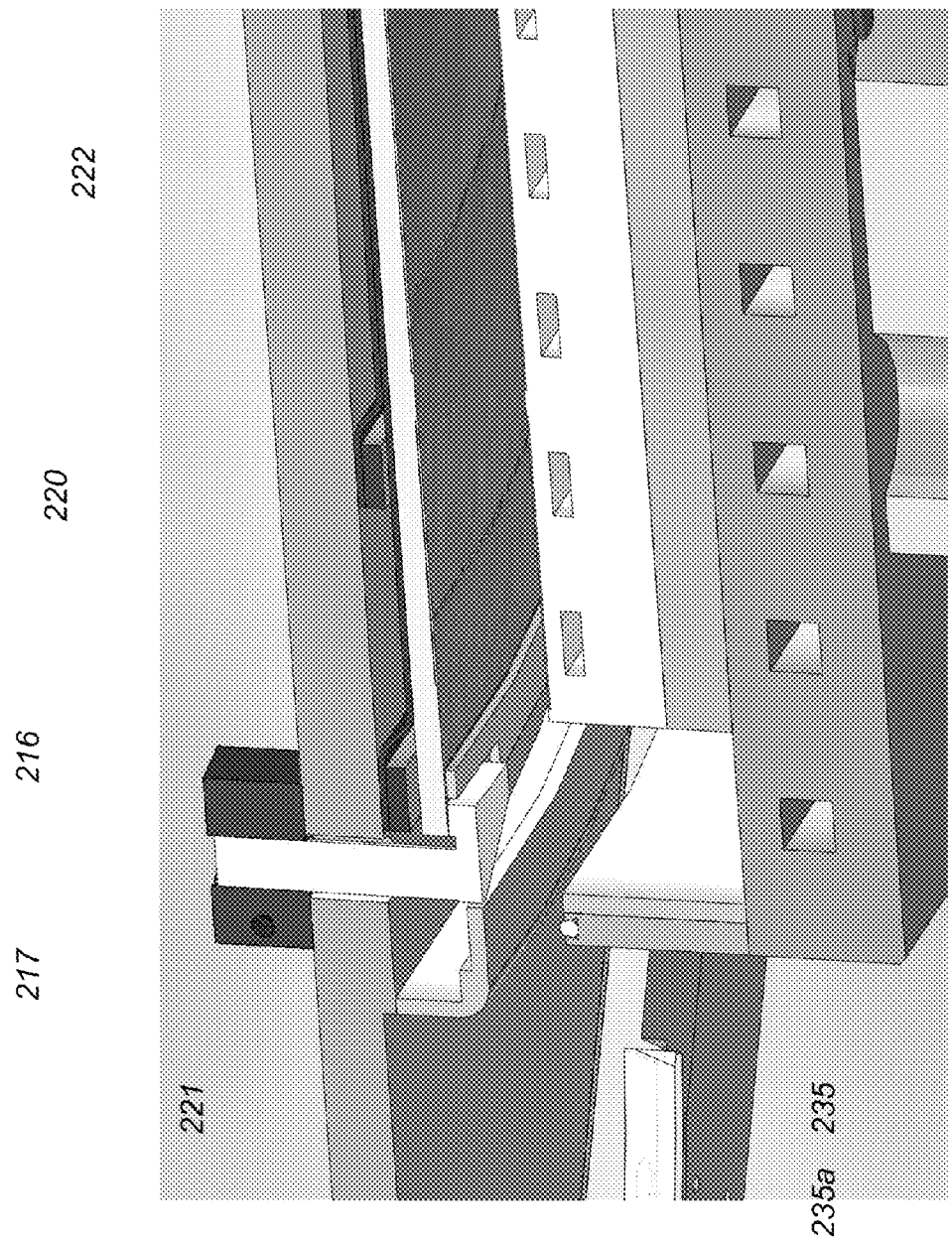
FIG. 9 depicts the top chuck leveling adjustment in the temporary wafer bonder of FIG. 5.
Figure 10:
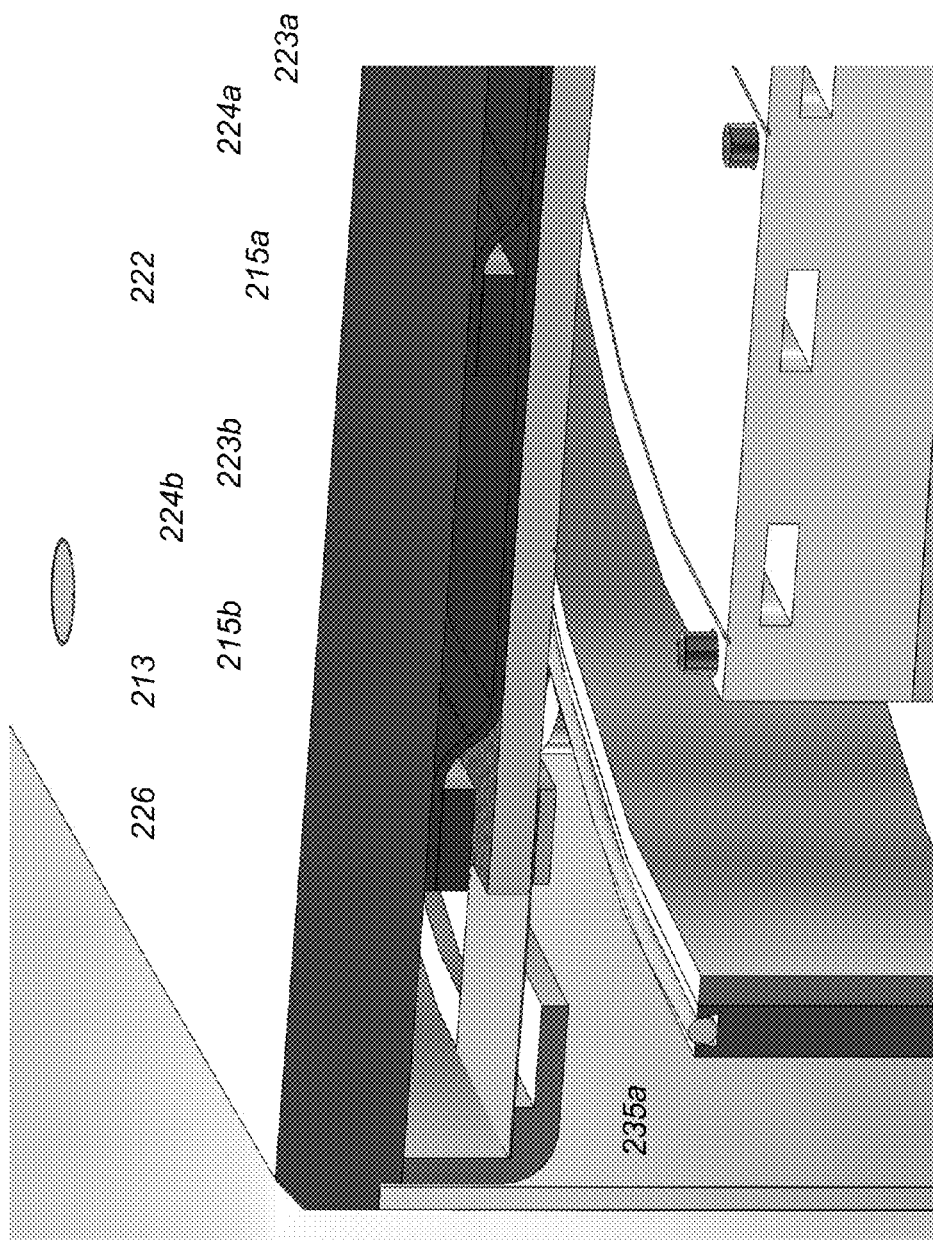
FIG. 10 depicts a cross-sectional view of the top chuck of the temporary wafer bonder of FIG. 5.

Referring to FIG. 9, the upper block assembly 220 includes an upper ceramic chuck 222, a top static chamber wall 221 against which the curtain 235 seals with seal element 235a, a 200 mm and a 300 mm membrane layers 224a, 224b, and three metal flexure straps 226 arranged circularly at 120 degrees. The membrane layers 224a, 224b, are clamped between the upper chuck 222 and the top housing wall 213 with clamps 215a, 215b, respectively, and form two separate vacuum zones 223a, 223b designed to hold 200 mm and 300 mm wafers, respectively, as shown in FIG. 10. Membrane layers 224a, 224b are made of elastomer material or metal bellows. The top ceramic chuck 222 is highly flat and thin. It has low mass and is semi-compliant in order to apply uniform pressure upon the wafer stack 10. The top chuck 222 is lightly pre-loaded with membrane pressure against three adjustable leveling clamp/drive assemblies 216. Clamp/drive assemblies 216 are circularly arranged at 120 degrees. The top chuck 222 is initially leveled while in contact with the lower ceramic heater plate 232, so that it is parallel to the heater plate 232. The three metal straps 226 act a flexures and provide X-Y-T (Theta) positioning with minimal Z-constraint. The clamp/drive assemblies 216 also provide a spherical Wedge Error Compensating (WEC) mechanism that rotates and/or tilts the ceramic chuck 222 around a center point corresponding to the center of the supported wafer without translation.

Figure 12:
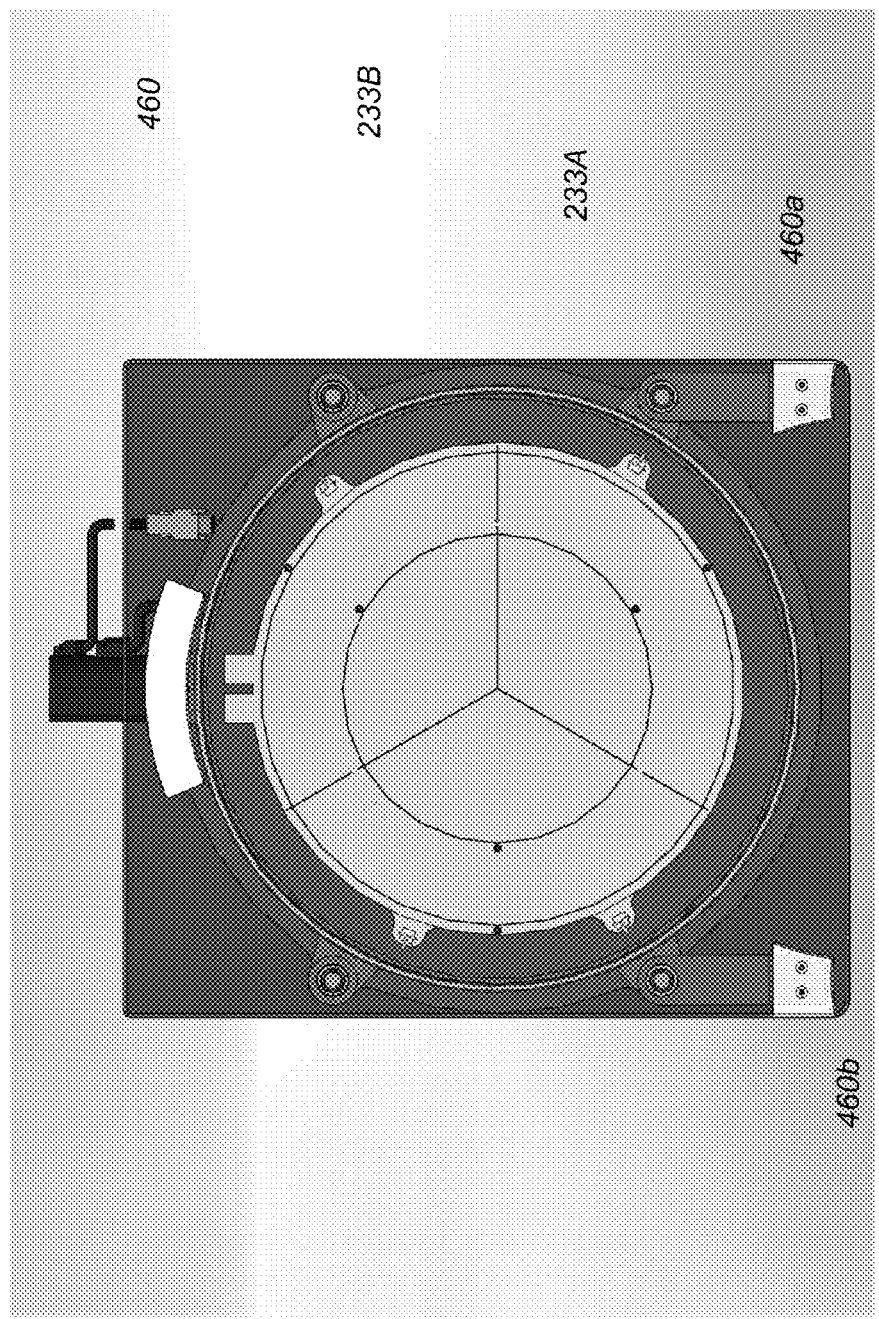
FIG. 12 depicts a wafer centering device with the pre-alignment arms in the open position.
Figure 13:
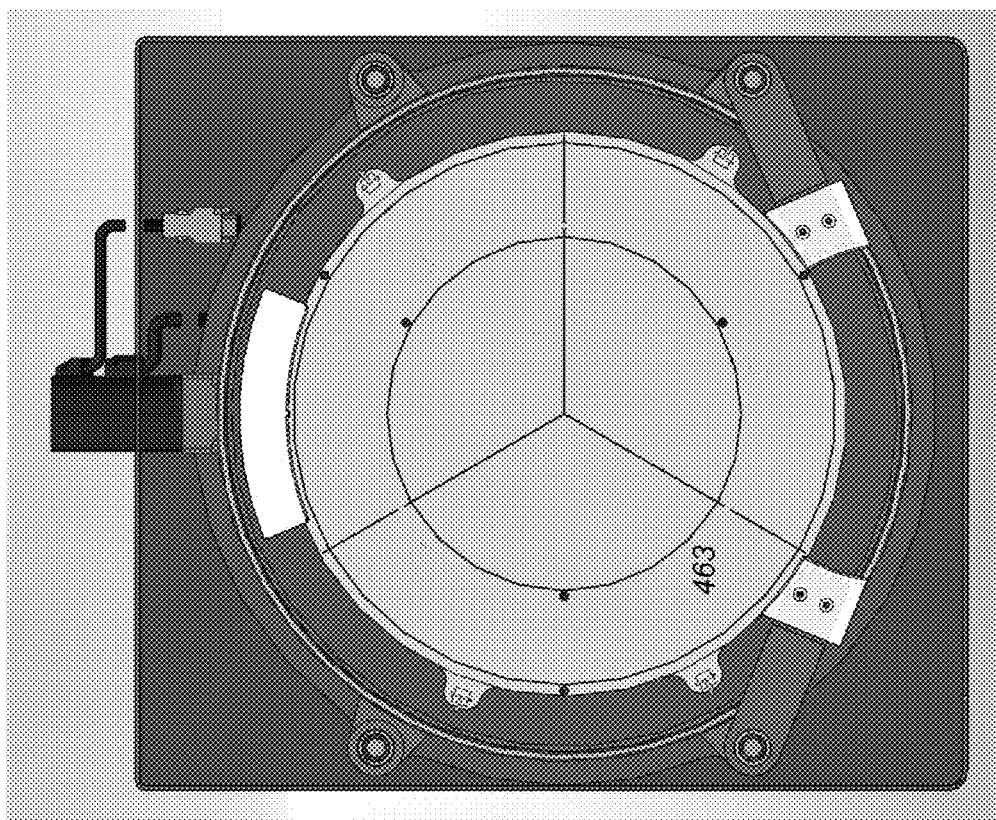
FIG. 13 depicts wafer centering device of FIG. 12 with the pre-alignment arms in the closed position.

The loading and pre-alignment of the wafers is facilitated with the mechanical centering device 460, shown in FIG. 12. Centering device 460 includes two pre-alignment arms 460a, 460b, shown in the open position in FIG. 12 and in the closed position in FIG. 13. At the ends of each arm 460a, 460b there are mechanical jaws 461a, 461b. The mechanical jaws 461a, 461b have tapered surfaces 462 and 463 that conform to the curved edge of the 300 mm wafer and 200 mm wafer, respectively.

Figure 14:
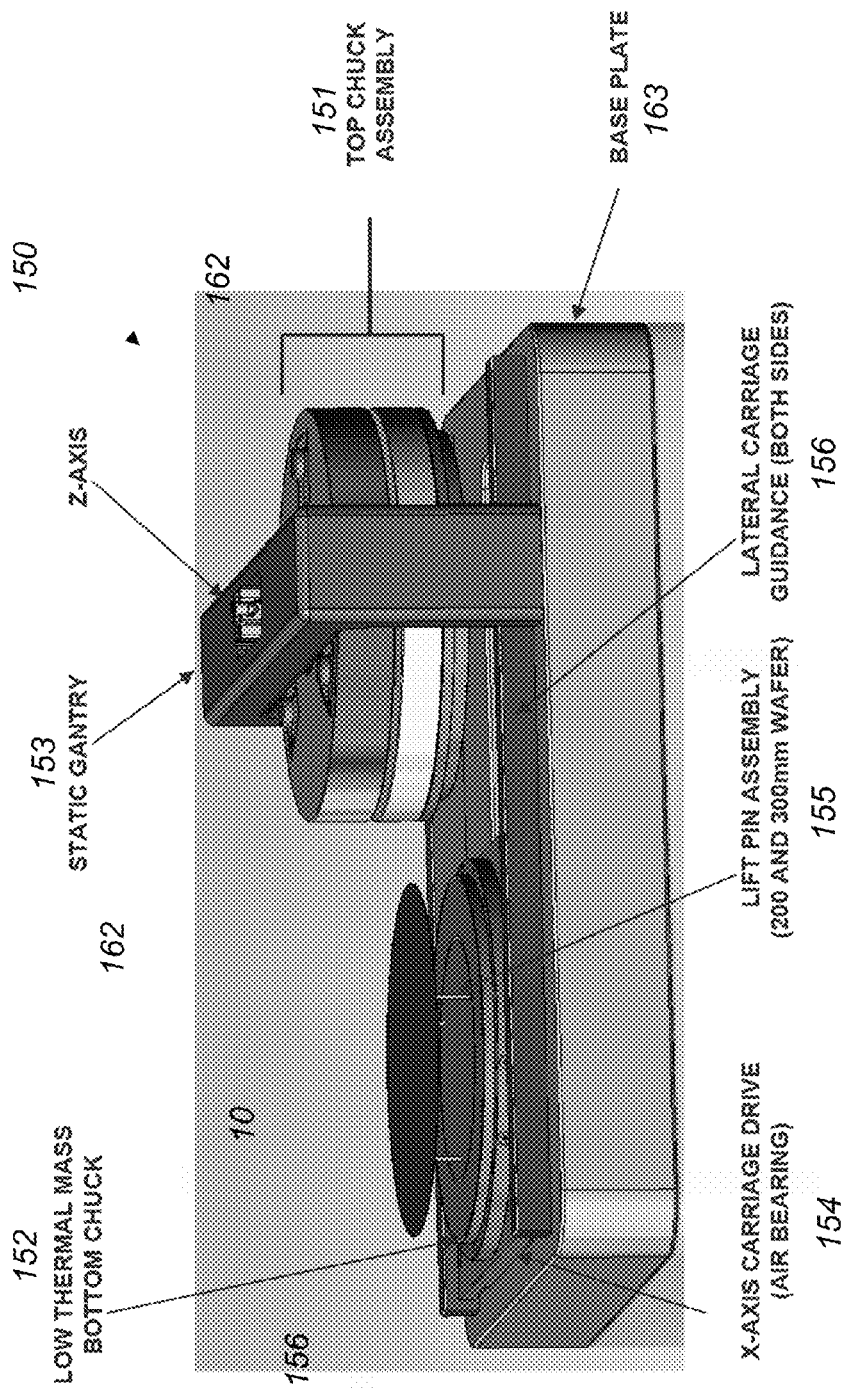
FIG. 14 depicts an overview diagram of the thermal slide debonder of FIG. 2.

Referring to FIG. 14, thermal slide debonder 150 includes a top chuck assembly 151, a bottom chuck assembly 152, a static gantry 153 supporting the top chuck assembly 151, an X-axis carriage drive 154 supporting the bottom chuck assembly 152, a lift pin assembly 155 designed to raise and lower wafers of various diameters including diameters of 200 mm and 300 mm, and a base plate 163 supporting the X-axis carriage drive 154 and gantry 153.

Figure 15:
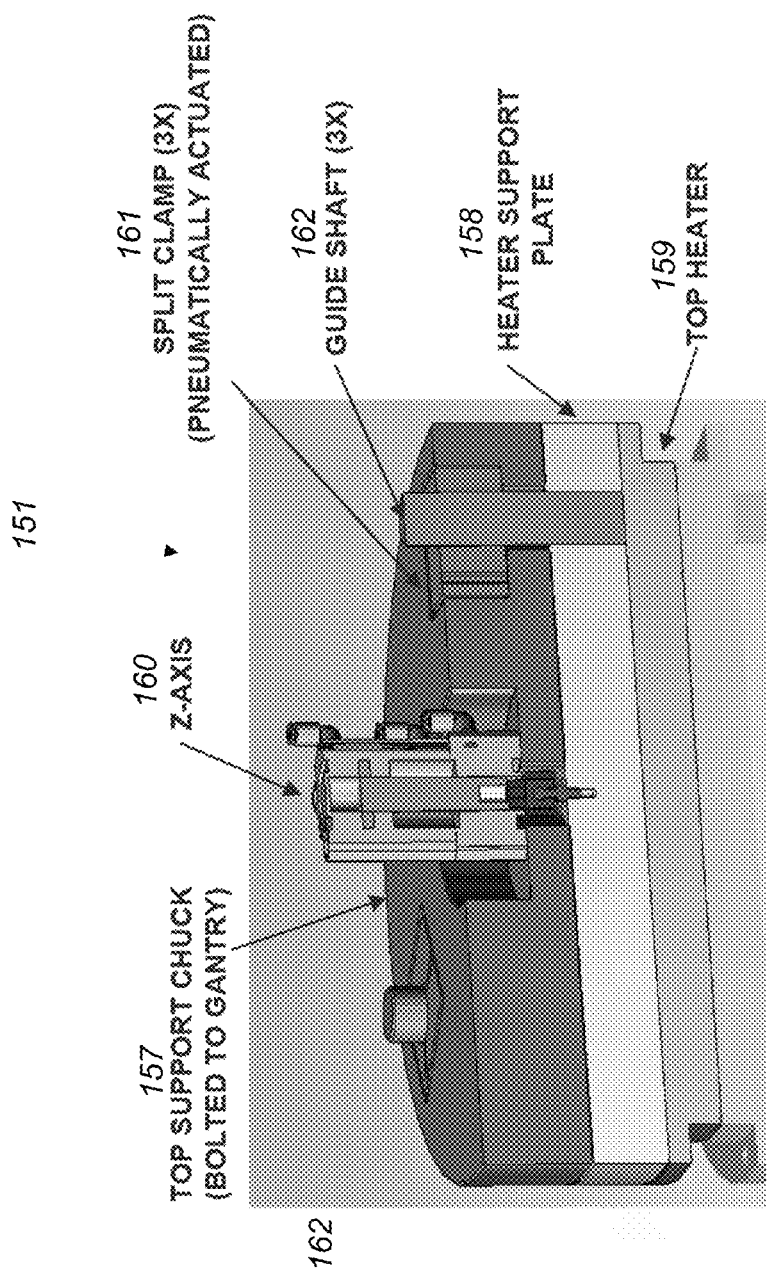
FIG. 15 depicts a cross-sectional view of the top chuck assembly of the debonder of FIG. 14.

Referring to FIG. 15, the top chuck assembly 151 includes a top support chuck 157 bolted to gantry 153, a heater support plate 158 in contact with the bottom surface of the top support chuck 157, a top heater 159 in contact with the bottom surface of the heater plate 158, a Z-axis drive 160 and a plate leveling system for leveling the upper wafer plate/heater bottom surface 164. The plate leveling system includes three guide shafts 162 that connect the top heater 159 to the top support chuck 157 and three pneumatically actuated split clamps 161. The plate leveling system provides a spherical Wedge Error Compensating (WEC) mechanism that rotates and/or tilts the upper wafer plate 164 around a center point corresponding to the center of the supported wafer without translation. The heater 159 is a steady state heater capable to heat the supported wafer stack 10 up to 350° C. Heater 159 includes a first heating zone configured to heat a 200 mm wafer or the center region of a 300 mm wafer and a second heating zone configured to heat the periphery of the 300 mm wafer. The first and second heating zones are controlled independently from each other in order to achieve thermal uniformity throughout the entire bond interface of the wafer stack and to mitigate thermal losses at the edges of the wafer stack. The heater support plate 158 is water cooled in order to provide thermal isolation and to prevent the propagation of any thermal expansion stresses that may be generated by the top heater 159.

Figure 16:
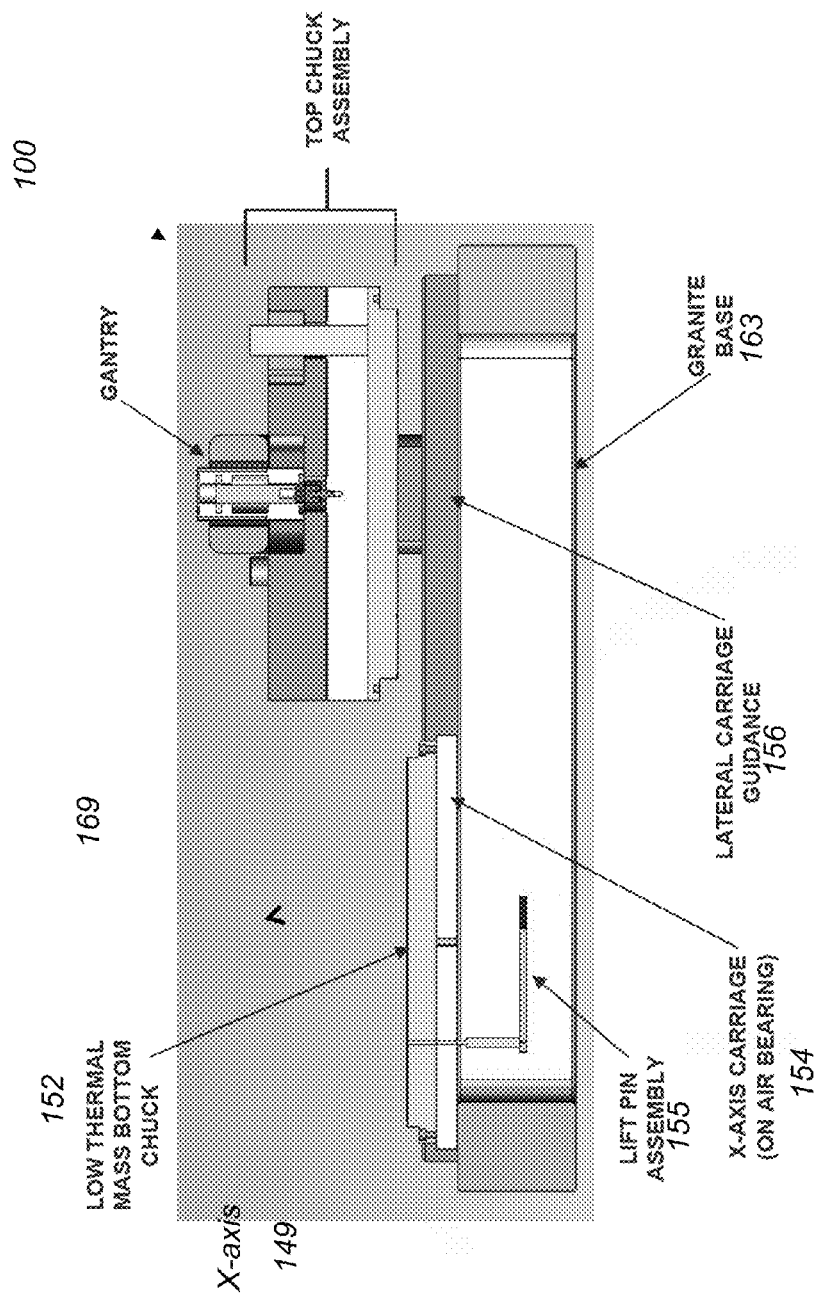
FIG. 16 depicts a cross-sectional side view of the debonder of FIG. 14.

Referring to FIG. 16, the bottom chuck 152 is made of a low thermal mass ceramic material and is designed to slide along the X-axis 149 on top of the air bearing carriage drive 154. The carriage drive 154 is guided in this X-axis motion by two parallel lateral carriage guidance tracks 156. Bottom chuck 152 is also designed to rotate along its Z-axis 169. A Z-axis rotation by a small angle (i.e., twisting) is used to initiate the separation of the wafers, as will be described below. The base plate 163 is vibration isolated. In one example, base plate is made of granite. In other examples base plate 156 has a honeycomb structure and is supported by pneumatic vibration isolators (not shown).

Figure 17A:
FIG. 17A, FIG. 17B depict the thermal slide debonder operational steps.
Figure 17A:
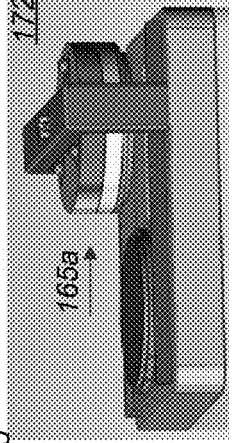
Figure 17A:
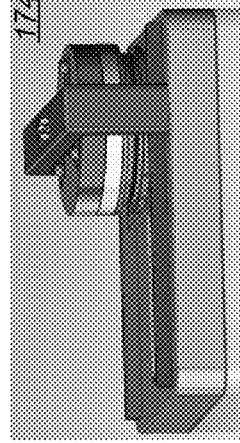
Figure 17A:
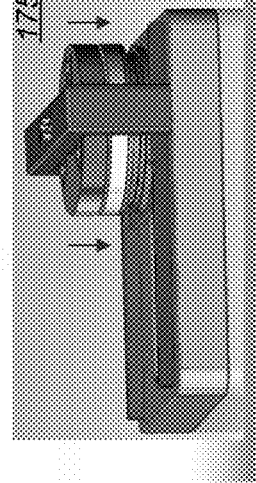
Figure 17B:
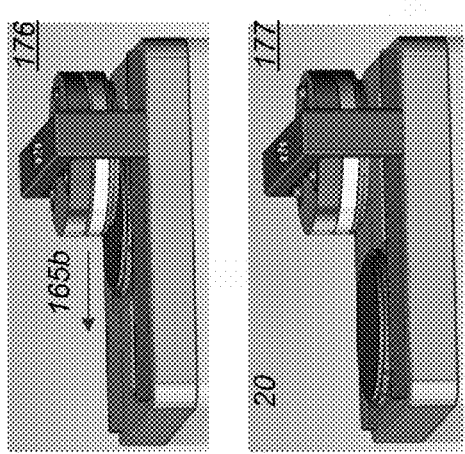

Referring to FIG. 17A, FIG. 17B, the debonding operation with the thermal slide debonder 150 of FIG. 16 includes the following steps. First, the temporary bonded wafer stack 10 is loaded on the primary lift pins 155 arranged so that the carrier wafer 30 is on the top and the thinned device wafer 20 is on the bottom (171). Next, the wafer stack 10 is lowered so that the bottom surface of the thinned device wafer 20 is brought into contact with the bottom chuck 152 (172). The bottom chuck 152 is then moved along the 165a direction until it is under the top heater 159 (174). Next, the Z-axis 160 of the top chuck 151 moves down and the bottom surface 164 of the top heater 159 is brought into contact with the top surface of the carrier wafer 30 and then air is floated on top heater 159 and carrier wafer 30 until the carrier wafer stack 30 reaches a set temperature. When the set temperature is reached, vacuum is pulled on the carrier wafer 30 so that is held by the top chuck assembly 151 and the guide shafts 162 are locked in the split clamps 162 (175). At this point the top chuck 151 is rigidly held while the bottom chuck 152 is compliant and the thermal slide separation is initiated (176) by first twisting the bottom chuck 152 and then moving the X-axis carriage 154 toward the 165b direction away from the rigidly held top chuck assembly 151 (177). The debonded thinned device wafer 20 is carried by the X-axis carriage 154 on top of chuck 152 to the unload position. Next, chuck 152 with the thinned debonded wafer 20 is moved to stations 170 and 180 for cleaning and taping, respectively (178). Alternatively, stations 170 and 180 are moved over chuck 152 with the debonded wafer 20 for cleaning and taping to take place (179).

Several embodiments of the present invention have been described. Nevertheless, it will be understood that various modifications may be made without departing from the spirit and scope of the invention. Accordingly, other embodiments are within the scope of the following claims.

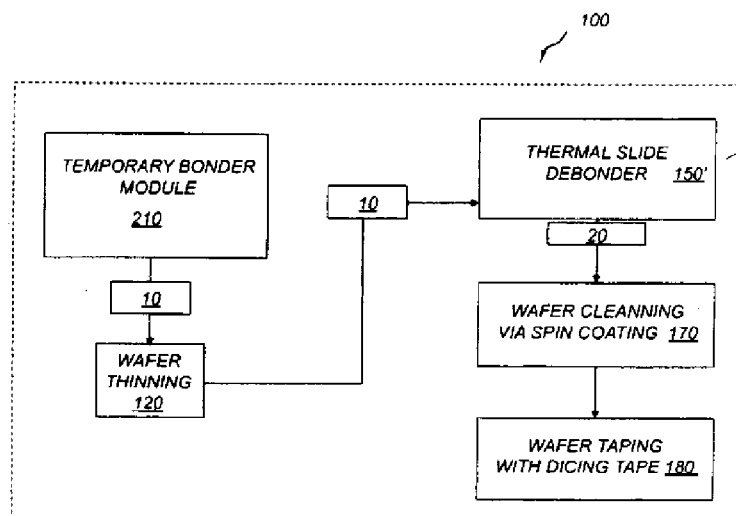

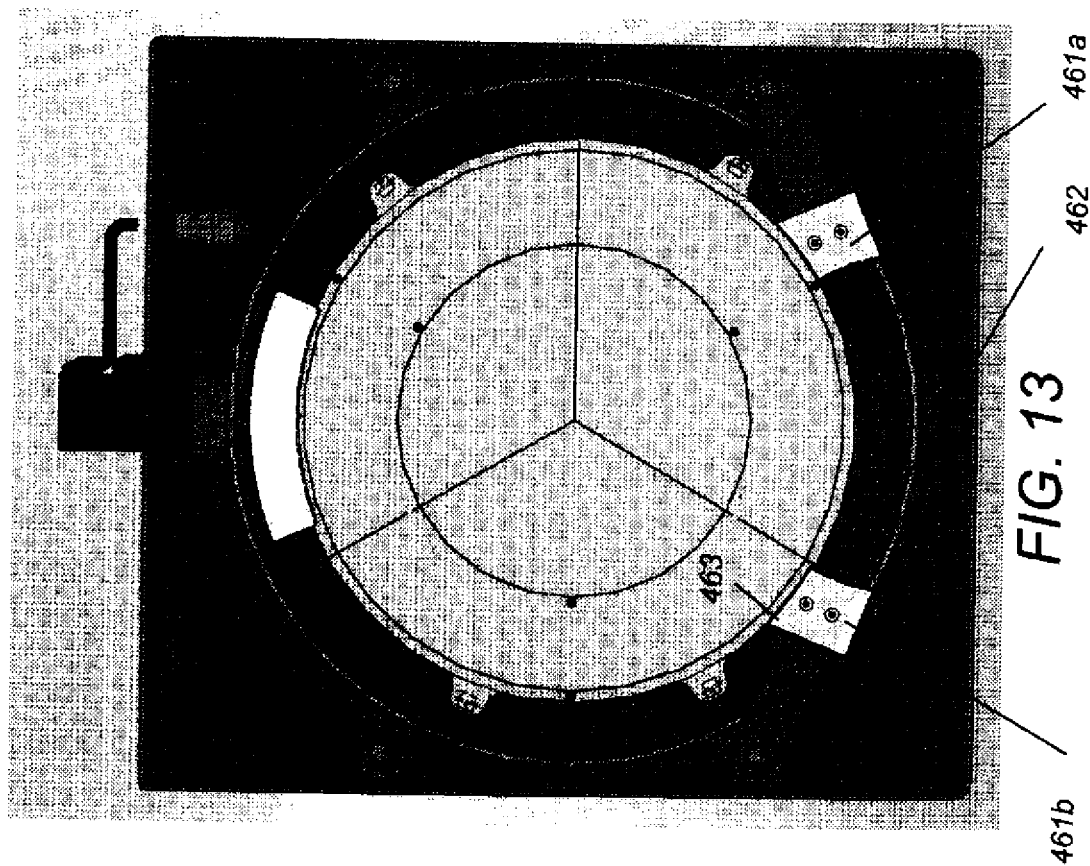

What is claimed is:

1. An apparatus for processing a temporary bonded wafer pair comprising a device wafer and a carrier wafer, said apparatus comprising:
   a debonder for debonding the device wafer from the carrier wafer;
   a cleaning module for cleaning the debonded device wafer;
   a taping module for applying a tape onto the debonded device wafer;
   a vacuum chuck wherein said vacuum chuck is used in the debonder during the debonding for holding the device wafer and comprises means for holding the debonded device wafer; and
   means for moving the vacuum chuck with the debonded device wafer into and out of the cleaning module and into and out of the taping module.

2. The apparatus of claim 1 wherein said debonder comprises a top chuck assembly, a bottom chuck assembly, a static gantry supporting the top chuck assembly, an X-axis carriage drive supporting the bottom chuck assembly and an X-axis drive control configured to drive horizontally the X-axis carriage drive and the bottom chuck assembly from a loading zone to a process zone under the top chuck assembly and from the process zone back to the loading zone, and wherein said bottom chuck assembly comprises said vacuum chuck.

3. The apparatus of claim 2 wherein said top chuck assembly comprises:
   a top support chuck bolted to the static gantry;
   a heater support plate in contact with the bottom surface of the top support chuck;
   said heater being in contact with the bottom surface of the heater support plate;
   a top wafer plate in contact with the heater;
   a Z-axis drive for moving the top wafer plate in the Z-direction and placing the top wafer plate in contact with the unbonded surface of the carrier wafer; and
   a plate leveling system for leveling the top wafer plate and for providing wedge error compensation of the top wafer plate.

4. The apparatus of claim 2 further comprising a lift pin assembly for raising and lowering said wafer pair onto the bottom chuck assembly.

5. The apparatus of claim 2 wherein said bonder further comprises a base plate supporting the X-axis carriage drive and the static gantry and wherein said base plate comprises one of a honeycomb structure with vibration isolation supports or a granite plate.

6. The apparatus of claim 2 further comprising means for twisting the device wafer at the same time said horizontal motion is initiated.

7. The apparatus of claim 2 wherein said X-axis carriage drive comprises an air bearing carriage drive.

8. The apparatus of claim 2 wherein said debonder further comprises two parallel lateral carriage guidance tracks guiding said X-axis carriage drive in its horizontal motion along the X-axis.

9. The apparatus of claim 2 wherein said carrier wafer is held by said top chuck assembly via vacuum pulling.

10. The apparatus of claim 3, wherein said plate leveling system comprises three guide shafts connecting said heater to said top support chuck and three pneumatically actuated split clamps.

11. The apparatus of claim 3, wherein said heater comprises two independently controlled concentric heating zones configured to heat wafers having a diameter of 200 or 300 millimeters, respectively.

12. The apparatus of claim 1 further comprising:
a bonder for temporary bonding the wafer pair; and
a wafer thinning module for thinning the device wafer of the temporarily bonded wafer pair.

13. An apparatus for processing a temporary bonded wafer pair comprising a device wafer and a carrier wafer, said apparatus comprising;
a debonder for debonding the device wafer from the carrier wafer;
a cleaning module for cleaning the debonded device wafer, wherein the cleaning module comprises means for moving over the debonded wafer in the debonder for cleaning the debonded wafer;
a taping module for applying a tape onto the debonded device wafer, wherein the taping module comprises means for moving over the debonded wafer in the debonder for applying the tape onto the debonded wafer; and
a vacuum chuck used in the debonder and comprising means for holding the debonded device wafer during debonding, cleaning and taping.

14. The apparatus of claim 13 wherein said debonder comprises a top chuck assembly, a bottom chuck assembly, a static gantry supporting the top chuck assembly, an X-axis carriage drive supporting the bottom chuck assembly and an X-axis drive control configured to drive horizontally the X-axis carriage drive and the bottom chuck assembly from a loading zone to a process zone under the top chuck assembly and from the process zone back to the loading zone, and wherein said bottom chuck assembly comprises said vacuum chuck.

15. The apparatus of claim 14 wherein said top chuck assembly comprises:
a top support chuck bolted to the static gantry;
a heater support plate in contact with the bottom surface of the top support chuck;
said heater being in contact with the bottom surface of the heater support plate;
a top wafer plate in contact with the heater;
a Z-axis drive for moving the top wafer plate in the Z-direction and placing the top wafer plate in contact with the unbonded surface of the carrier wafer; and
a plate leveling system for leveling the top wafer plate and for providing wedge error compensation of the top wafer plate.

16. The apparatus of claim 14 further comprising a lift pin assembly for raising and lowering said wafer pair onto the bottom chuck assembly.

17. The apparatus of claim 14 wherein said bonder further comprises a base plate supporting the X-axis carriage drive and the static gantry and wherein said base plate comprises one of a honeycomb structure with vibration isolation supports or a granite plate.

18. The apparatus of claim 14 further comprising means for twisting the device wafer at the same time said horizontal motion is initiated.

19. The apparatus of claim 14 wherein said X-axis carriage drive comprises an air bearing carriage drive.

20. The apparatus of claim 14 wherein said debonder further comprises two parallel lateral carriage guidance tracks guiding said X-axis carriage drive in its horizontal motion along the X-axis.

21. The apparatus of claim 14 wherein said carrier wafer is held by said top chuck assembly via vacuum pulling.

22. The apparatus of claim 15, wherein said plate leveling system comprises three guide shafts connecting said heater to said top support chuck and three pneumatically actuated split clamps.

23. The apparatus of claim 15, wherein said heater comprises two independently controlled concentric heating zones configured to heat wafers having a diameter of 200 or 300 millimeters, respectively.

24. The apparatus of claim 13 further comprising:
a bonder for temporary bonding the wafer pair; and
a wafer thinning module for thinning the device wafer of the temporarily bonded wafer pair.

* * * * *

UNITED STATES PATENT AND TRADEMARK OFFICE
CERTIFICATE OF CORRECTION

PATENT NO.       : 8,343,300 B2
APPLICATION NO.  : 12/975521
DATED            : January 1, 2013
INVENTOR(S)      : Hermanoski It is certified that error appears in the above-identified patent and that said Letters Patent is hereby corrected as shown below:

The Title page showing the illustrative figure should be deleted to be replaced with the attached title page.

In the drawings, Figs. 1-17B, should be replaced with the corrected Figs. 1-17B, as shown on the attached pages.

Signed and Sealed this
Eleventh Day of February, 2014

Michelle K. Lee
*Deputy Director of the United States Patent and Trademark Office*

(12) United States Patent
Hermanowski

(10) Patent No.: US 8,343,300 B2
(45) Date of Patent: Jan. 1, 2013

(54) AUTOMATED THERMAL SLIDE DEBONDER

(75) Inventor: James Hermanowski, Waterbury, VT (US)

(73) Assignee: Suss Microtec Lithography, GmbH, Garching (DE)

( * ) Notice: Subject to any disclaimer, the term of this patent is extended or adjusted under 35 U.S.C. 154(b) by 131 days.

(21) Appl. No.: 12/975,521

(22) Filed: Dec. 22, 2010

(65) Prior Publication Data

US 2011/0146901 A1 Jun. 23, 2011
US 2012/0037307 A9 Feb. 16, 2012

Related U.S. Application Data

(60) Provisional application No. 61/289,634, filed on Dec. 23, 2009.

(51) Int. Cl.
| | |
|---|---|
| B29C 65/00 | (2006.01) |
| B29C 63/00 | (2006.01) |
| B32B 37/00 | (2006.01) |
| B32B 38/00 | (2006.01) |
| B65H 1/00 | (2006.01) |
| B65G 25/00 | (2006.01) |
| B66C 17/08 | (2006.01) |
| H01L 21/677 | (2006.01) |
| B24B 49/00 | (2012.01) |
| B24B 51/00 | (2006.01) |
| B24B 1/00 | (2006.01) |
| B24B 7/19 | (2006.01) |
| B24B 7/30 | (2006.01) |
| B24B 3/00 | (2006.01) |
| B24B 5/18 | (2006.01) |
| B24B 5/00 | (2006.01) |
| B24B 29/00 | (2006.01) |

(52) U.S. Cl. ........ 156/281; 156/285; 156/286; 156/707; 156/382; 156/758; 414/225.01; 414/200; 414/217; 414/201; 451/43; 451/141; 451/5; 451/285

(58) Field of Classification Search .......... 156/281, 156/285, 286, 707, 382, 758; 414/225.01, 414/200, 217, 201; 451/43, 141, 5, 285
See application file for complete search history.

(56) References Cited

U.S. PATENT DOCUMENTS

| | | | | |
|---|---|---|---|---|
| 5,273,615 | A * | 12/1993 | Asetta et al. | 156/750 |
| 5,679,060 | A * | 10/1997 | Leonard et al. | 451/43 |
| 5,950,643 | A | 9/1999 | Miyazaki et al. | |
| 2003/0057130 | A1 * | 3/2003 | Fix et al. | 206/710 |

(Continued)

FOREIGN PATENT DOCUMENTS

WO WO2008146994 A1 12/2008

*Primary Examiner* — Christopher Schatz
*Assistant Examiner* — Matthew Hoover
(74) *Attorney, Agent, or Firm* — AKC Patents LLC; Aliki K. Collins

(57) ABSTRACT

An improved apparatus for debonding temporary bonded wafers includes a debonder, a cleaning module and a taping module. A vacuum chuck is used in the debonder for holding the debonded thinned wafer and remains with the thinned debonded wafer during the follow up processes steps of cleaning and mounting onto a dicing tape. In one embodiment the debonded thinned wafer remains onto the vacuum chuck and is moved with the vacuum chuck into the cleaning module and then the taping module. In another embodiment the debonded thinned wafer remains onto the vacuum chuck and first the cleaning module moves over the thinned wafer to clean the wafer and then the taping module moves over the thinned wafer to mount a dicing tape onto the wafer.

24 Claims, 22 Drawing Sheets